(12) United States Patent
Gupta et al.

(10) Patent No.: US 9,088,003 B2
(45) Date of Patent: Jul. 21, 2015

(54) REDUCING SHEET RESISTANCE FOR COMMON ELECTRODE IN TOP EMISSION ORGANIC LIGHT EMITTING DIODE DISPLAY

(71) Applicant: Apple Inc., Cupertino, CA (US)

(72) Inventors: Vasudha Gupta, Cupertino, CA (US); Youngbae Park, Cupertino, CA (US); Shih Chang Chang, Cupertino, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 214 days.

(21) Appl. No.: 13/787,708

(22) Filed: Mar. 6, 2013

(65) Prior Publication Data

US 2014/0252317 A1    Sep. 11, 2014

(51) Int. Cl.
*H01L 51/50* (2006.01)
*H01L 51/52* (2006.01)
*H01L 51/56* (2006.01)

(52) U.S. Cl.
CPC ............ *H01L 51/5203* (2013.01); *H01L 51/50* (2013.01); *H01L 51/5262* (2013.01); *H01L 51/5209* (2013.01); *H01L 51/5225* (2013.01)

(58) Field of Classification Search
CPC ........................ H01L 51/5225–51/5234; H01L 51/5209–51/5218; H01L 51/5262; H01L 51/56; H01L 51/5203
USPC .................. 257/E51.001, E51.018, E51.022; 438/99, 623
See application file for complete search history.

(56) References Cited

U.S. PATENT DOCUMENTS

| 4,080,619 A | 3/1978 | Suzuki |
| 4,958,205 A | 9/1990 | Takeda et al. |
| 5,075,237 A | 12/1991 | Wu |
| 5,642,129 A | 6/1997 | Zavracky et al. |
| 5,668,613 A | 9/1997 | Kim et al. |

(Continued)

FOREIGN PATENT DOCUMENTS

| EP | 0376329 | 7/1990 |
| EP | 2048538 | 4/2009 |

(Continued)

OTHER PUBLICATIONS

U.S. Appl. No. 14/268,946, filed Apr. 22, 2014, Roudbari, et al.

(Continued)

*Primary Examiner* — Laura Menz
*Assistant Examiner* — Maliheh Malek
(74) *Attorney, Agent, or Firm* — Joseph F. Guihan

(57) ABSTRACT

An organic light emitting diode display includes a thin film transistor (TFT) substrate, which has TFTs for an array of pixels. Each TFT has a gate electrode, a source electrode, and a drain electrode. An organic layer is disposed over the TFT substrate. The organic layer has through-hole above the drain electrode. The display also includes pixel electrodes disposed over the organic layer. Each pixel electrode is connected to the drain electrode in the through-hole of the organic layer for each pixel. An organic light emitting diode (OLED) layer is disposed over the pixel electrode for each pixel. The organic light emitting layer is divided into pixels or sub-pixels by a pixel defining layer over the pixel electrode. The display further includes a common electrode and a conductive layer disposed over the OLED layer such that the conductive layer does not block light emission from the organic light emitting layer.

26 Claims, 15 Drawing Sheets

(56) References Cited

U.S. PATENT DOCUMENTS

| | | | |
|---|---|---|---|
| 5,698,902 A | 12/1997 | Uehara et al. | |
| 5,721,155 A | 2/1998 | Lee | |
| 5,990,492 A | 11/1999 | Kim et al. | |
| 5,994,721 A | 11/1999 | Zhong et al. | |
| 6,246,179 B1 | 6/2001 | Yamada | |
| 6,372,636 B1 | 4/2002 | Chooi et al. | |
| 6,406,928 B1 | 6/2002 | Jen | |
| 6,479,398 B1 | 11/2002 | Chen, Jr. | |
| 6,509,614 B1 | 1/2003 | Shih | |
| 6,525,342 B2 | 2/2003 | Amemiya | |
| 6,548,960 B2 | 4/2003 | Inukai | |
| 6,613,620 B2 | 9/2003 | Fujimoto et al. | |
| 6,686,273 B2 | 2/2004 | Hsu et al. | |
| 6,768,531 B2 | 7/2004 | Ochiai et al. | |
| 6,812,637 B2 | 11/2004 | Cok et al. | |
| 6,967,407 B2 | 11/2005 | Otani et al. | |
| 7,030,553 B2* | 4/2006 | Winters et al. | 313/504 |
| 7,045,406 B2 | 5/2006 | Huotari et al. | |
| 7,129,634 B2 | 10/2006 | Boroson et al. | |
| 7,190,419 B2 | 3/2007 | Park | |
| 7,199,518 B2 | 4/2007 | Couillard | |
| 7,209,057 B2 | 4/2007 | Hashido et al. | |
| 7,227,542 B2 | 6/2007 | Koyama | |
| 7,402,468 B2 | 7/2008 | Park et al. | |
| 7,419,858 B2 | 9/2008 | Schuele et al. | |
| 7,510,891 B2 | 3/2009 | Chun et al. | |
| 7,550,306 B2 | 6/2009 | Park et al. | |
| 7,553,707 B2 | 6/2009 | Horino et al. | |
| 7,563,669 B2 | 7/2009 | Chittipeddi et al. | |
| 7,602,456 B2 | 10/2009 | Tanaka | |
| 7,609,342 B2 | 10/2009 | Yang et al. | |
| 7,671,939 B2 | 3/2010 | Araki et al. | |
| 7,692,186 B2* | 4/2010 | Yamazaki et al. | 257/40 |
| 7,759,857 B2 | 7/2010 | Vaufrey et al. | |
| 7,816,677 B2 | 10/2010 | Lee et al. | |
| 7,843,130 B2 | 11/2010 | Shimizu et al. | |
| 7,855,508 B2 | 12/2010 | Cok et al. | |
| 7,919,918 B2 | 4/2011 | Kim | |
| 7,952,104 B2 | 5/2011 | Leonardi et al. | |
| 7,956,825 B2 | 6/2011 | Kane | |
| 7,969,087 B2 | 6/2011 | Hwang et al. | |
| 7,973,470 B2 | 7/2011 | Cok | |
| 8,053,978 B2 | 11/2011 | Hwang et al. | |
| 8,064,028 B2 | 11/2011 | Katayama et al. | |
| 8,072,080 B2 | 12/2011 | Moriwaki | |
| 8,089,429 B2 | 1/2012 | Yamashita et al. | |
| 8,102,338 B2 | 1/2012 | Hwang et al. | |
| 8,133,748 B2 | 3/2012 | Yamazaki et al. | |
| 8,236,628 B2 | 8/2012 | Liu et al. | |
| 8,278,162 B2 | 10/2012 | Akimoto et al. | |
| 8,278,661 B2 | 10/2012 | Song | |
| 8,294,147 B2 | 10/2012 | Yamazaki et al. | |
| 8,297,991 B2 | 10/2012 | Adachi | |
| 8,309,953 B2* | 11/2012 | Tessler et al. | 257/40 |
| 8,339,531 B2 | 12/2012 | Yamauchi | |
| 8,363,197 B2 | 1/2013 | Matsuda et al. | |
| 8,368,674 B2 | 2/2013 | Kim et al. | |
| 8,377,762 B2 | 2/2013 | Eguchi et al. | |
| 8,427,607 B2 | 4/2013 | Lee et al. | |
| 8,455,872 B2 | 6/2013 | French | |
| 8,471,256 B2 | 6/2013 | Yamazaki et al. | |
| 8,508,562 B2 | 8/2013 | Akimoto et al. | |
| 8,508,709 B2 | 8/2013 | Huang et al. | |
| 8,552,655 B2 | 10/2013 | Ono | |
| 8,568,877 B2 | 10/2013 | Ferrari et al. | |
| 8,598,574 B2* | 12/2013 | Tsurume | 257/40 |
| 8,610,860 B2 | 12/2013 | Huang et al. | |
| 8,692,743 B2 | 4/2014 | Tsai et al. | |
| 8,859,947 B2 | 10/2014 | Adachi | |
| 2003/0006697 A1* | 1/2003 | Weaver | 313/503 |
| 2003/0076282 A1 | 4/2003 | Ikeda et al. | |
| 2003/0089913 A1* | 5/2003 | Takayama et al. | 257/79 |
| 2004/0080267 A1* | 4/2004 | Cok | 313/512 |
| 2005/0029926 A1* | 2/2005 | Park et al. | 313/500 |
| 2005/0247936 A1* | 11/2005 | Bae et al. | 257/59 |
| 2006/0055999 A1* | 3/2006 | Bae et al. | 359/245 |
| 2006/0082292 A1* | 4/2006 | Kang et al. | 313/504 |
| 2006/0152151 A1* | 7/2006 | Seo | 313/506 |
| 2007/0108899 A1* | 5/2007 | Jung et al. | 313/506 |
| 2007/0132368 A1* | 6/2007 | Kuwahara et al. | 313/503 |
| 2007/0268229 A1 | 11/2007 | Kang et al. | |
| 2008/0174239 A1* | 7/2008 | Yoo et al. | 313/504 |
| 2008/0252202 A1 | 10/2008 | Li et al. | |
| 2009/0102052 A1 | 4/2009 | Ryu | |
| 2010/0051929 A1* | 3/2010 | Choi | 257/40 |
| 2010/0097295 A1* | 4/2010 | Kwak | 345/32 |
| 2010/0156771 A1 | 6/2010 | Lee et al. | |
| 2010/0330811 A1 | 12/2010 | Nagao | |
| 2011/0012125 A1 | 1/2011 | Nicholas | |
| 2011/0031500 A1* | 2/2011 | Suh | 257/59 |
| 2011/0175846 A1* | 7/2011 | Wang et al. | 345/174 |
| 2011/0227850 A1 | 9/2011 | Oh et al. | |
| 2011/0266565 A1* | 11/2011 | Wang et al. | 257/91 |
| 2012/0018770 A1* | 1/2012 | Lu et al. | 257/99 |
| 2012/0087460 A1 | 4/2012 | Moriwaki | |
| 2012/0105495 A1 | 5/2012 | Choi | |
| 2012/0119211 A1 | 5/2012 | Lin | |
| 2012/0162584 A1* | 6/2012 | Chang et al. | 349/106 |
| 2012/0169636 A1* | 7/2012 | Liu | 345/173 |
| 2012/0205658 A1 | 8/2012 | Yamazaki et al. | |
| 2012/0248455 A1 | 10/2012 | Van Gestel | |
| 2012/0268396 A1 | 10/2012 | Kim et al. | |
| 2012/0286299 A1* | 11/2012 | Lee et al. | 257/88 |
| 2012/0287102 A1 | 11/2012 | Toyomura et al. | |
| 2012/0299976 A1 | 11/2012 | Chen et al. | |
| 2013/0021289 A1* | 1/2013 | Chen et al. | 345/174 |
| 2013/0027646 A1 | 1/2013 | Cho et al. | |
| 2013/0069061 A1 | 3/2013 | Nakazawa | |
| 2013/0161622 A1 | 6/2013 | Lee | |
| 2013/0182418 A1* | 7/2013 | Sawabe et al. | 362/157 |
| 2013/0187133 A1* | 7/2013 | Sugano | 257/40 |
| 2013/0248825 A1* | 9/2013 | Sugizaki et al. | 257/40 |
| 2013/0328053 A1 | 12/2013 | Roudbari et al. | |
| 2013/0335658 A1 | 12/2013 | Huang et al. | |
| 2013/0337596 A1 | 12/2013 | Hung et al. | |
| 2014/0057043 A1* | 2/2014 | Cok | 427/66 |
| 2014/0061656 A1 | 3/2014 | Yu et al. | |
| 2014/0070225 A1 | 3/2014 | Yu et al. | |
| 2014/0078077 A1* | 3/2014 | Choi | 345/173 |
| 2014/0084292 A1 | 3/2014 | Hung et al. | |
| 2014/0091390 A1 | 4/2014 | Hung et al. | |
| 2014/0103349 A1 | 4/2014 | Yu et al. | |
| 2014/0104527 A1 | 4/2014 | Yang et al. | |
| 2014/0120657 A1 | 5/2014 | Hung et al. | |
| 2014/0203245 A1* | 7/2014 | Gupta et al. | 257/40 |
| 2014/0204067 A1 | 7/2014 | Gupta | |
| 2014/0211120 A1* | 7/2014 | Yang et al. | 349/46 |
| 2014/0225117 A1 | 8/2014 | Roudbari et al. | |
| 2014/0225838 A1* | 8/2014 | Gupta et al. | 345/173 |
| 2014/0225839 A1* | 8/2014 | Dunphy et al. | 345/173 |
| 2014/0346484 A1* | 11/2014 | Nendai et al. | 257/40 |
| 2014/0353657 A1* | 12/2014 | Hayashi | 257/40 |
| 2014/0370706 A1* | 12/2014 | Yamazaki et al. | 438/687 |

FOREIGN PATENT DOCUMENTS

| | | |
|---|---|---|
| JP | 2010056015 | 3/2010 |
| TW | 201142797 | 12/2011 |
| WO | WO 2011/030620 | 3/2011 |
| WO | WO 2011/151970 | 12/2011 |

OTHER PUBLICATIONS

U.S. Appl. No. 13/601,535, filed Aug. 31, 2012, Yu et al.
U.S. Appl. No. 13/629,524, filed Sep. 27, 2012, Huang et al.
U.S. Appl. No. 13/629,531, filed Sep. 27, 2012, Roudbari et al.
U.S. Appl. No. 13/629,547, filed Sep. 27, 2012, Hung et al.
U.S. Appl. No. 13/631,385, filed Sep. 28, 2012, Hung et al.
U.S. Appl. No. 13/654,256, filed Oct. 17, 2012, Yang et al.
U.S. Appl. No. 13/664,240, filed Oct. 30, 2012, Hung et al.

(56) References Cited

OTHER PUBLICATIONS

U.S. Appl. No. 13/745,932, filed Jan. 21, 2013, Gupta.
U.S. Appl. No. 13/749,394, filed Jan. 24, 2013, Gupta et al.
U.S. Appl. No. 13/752,612, filed Jan. 29, 2013, Yang et al.
U.S. Appl. No. 13/801,261, filed Mar. 13, 2013, Yu et al.
U.S. Appl. No. 13/913,373, filed Jun. 7, 2013, Hung et al.
U.S. Appl. No. 14/020,620, filed Sep. 6, 2013, Yu et al.

* cited by examiner

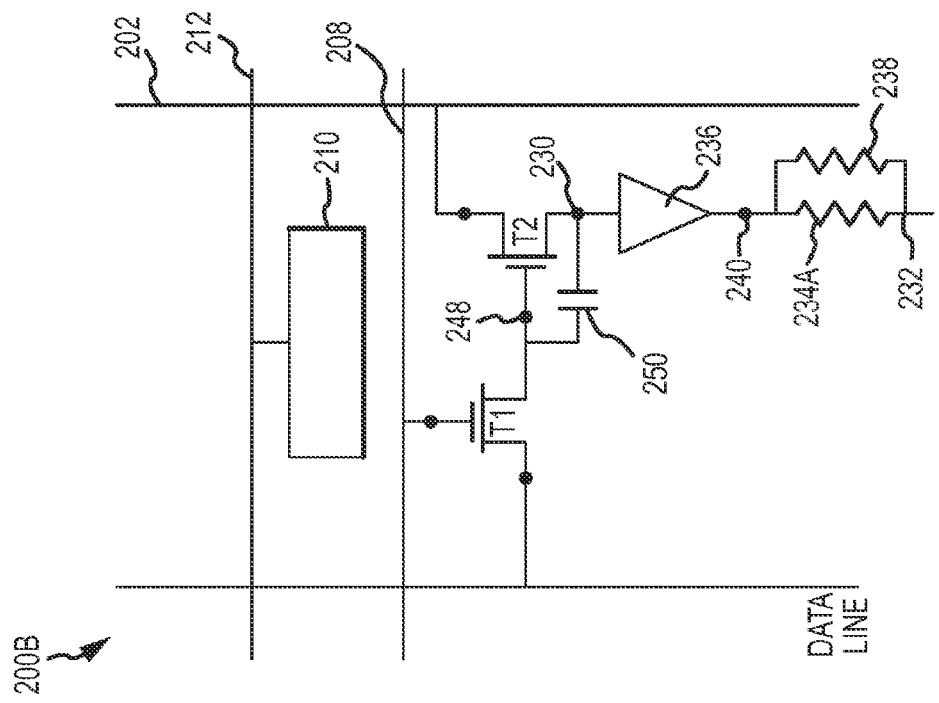
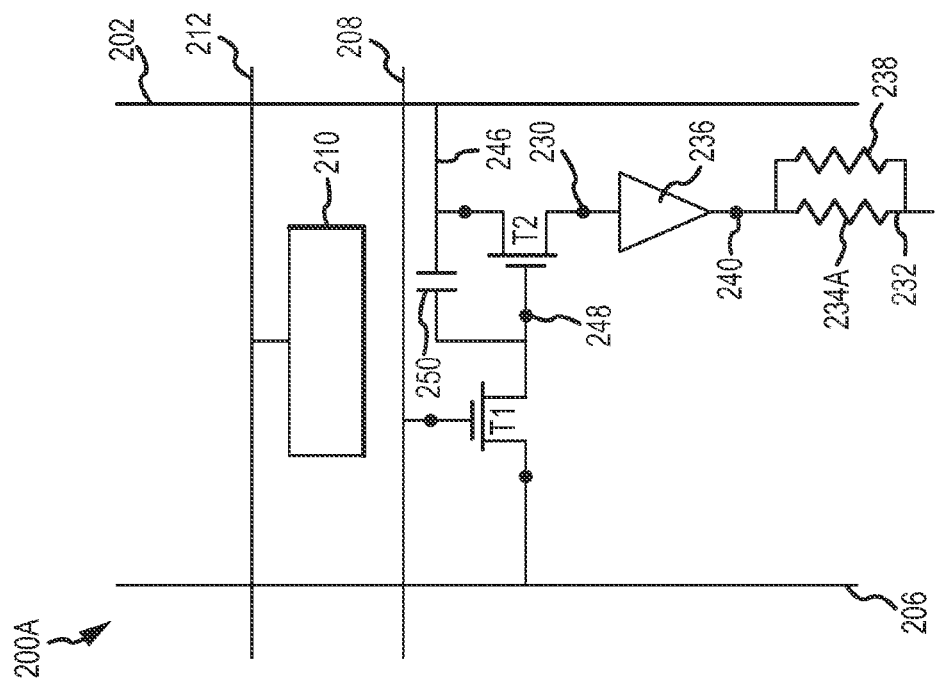

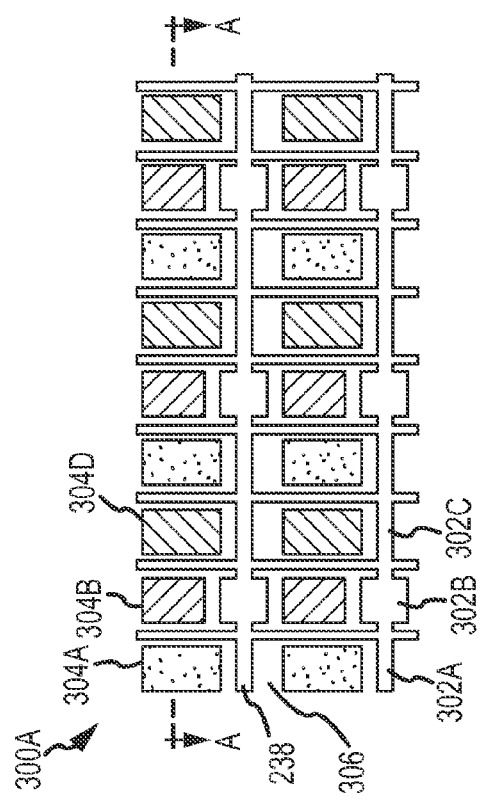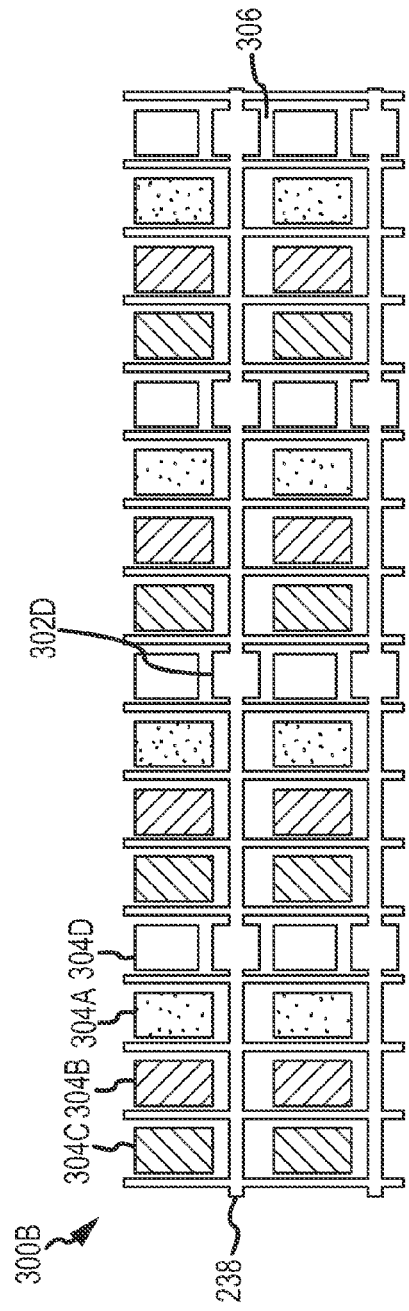

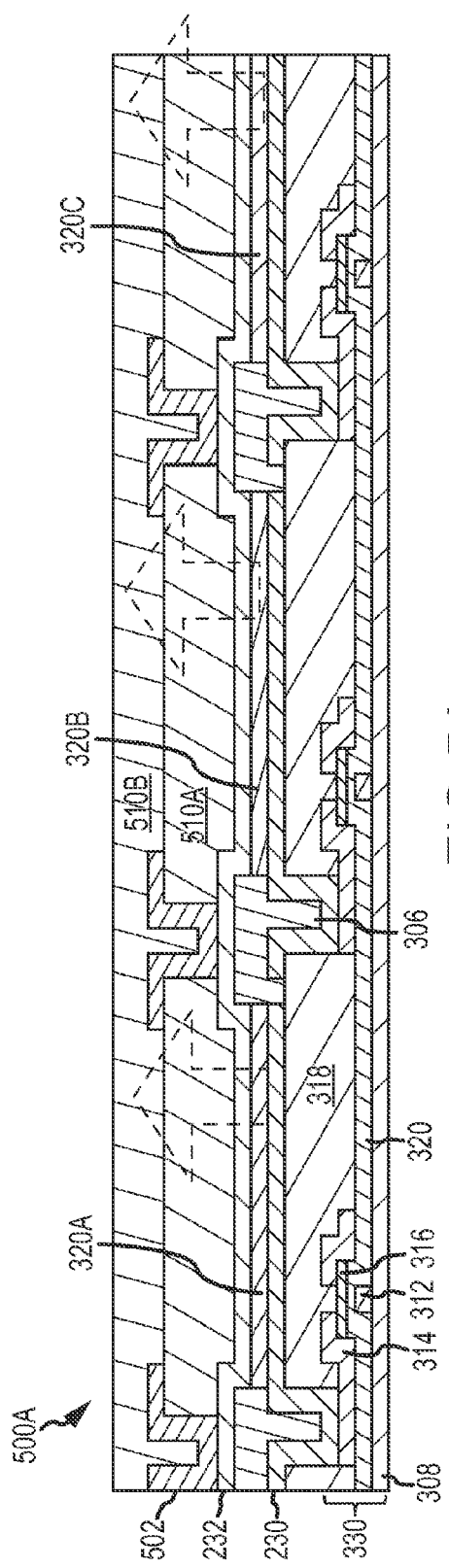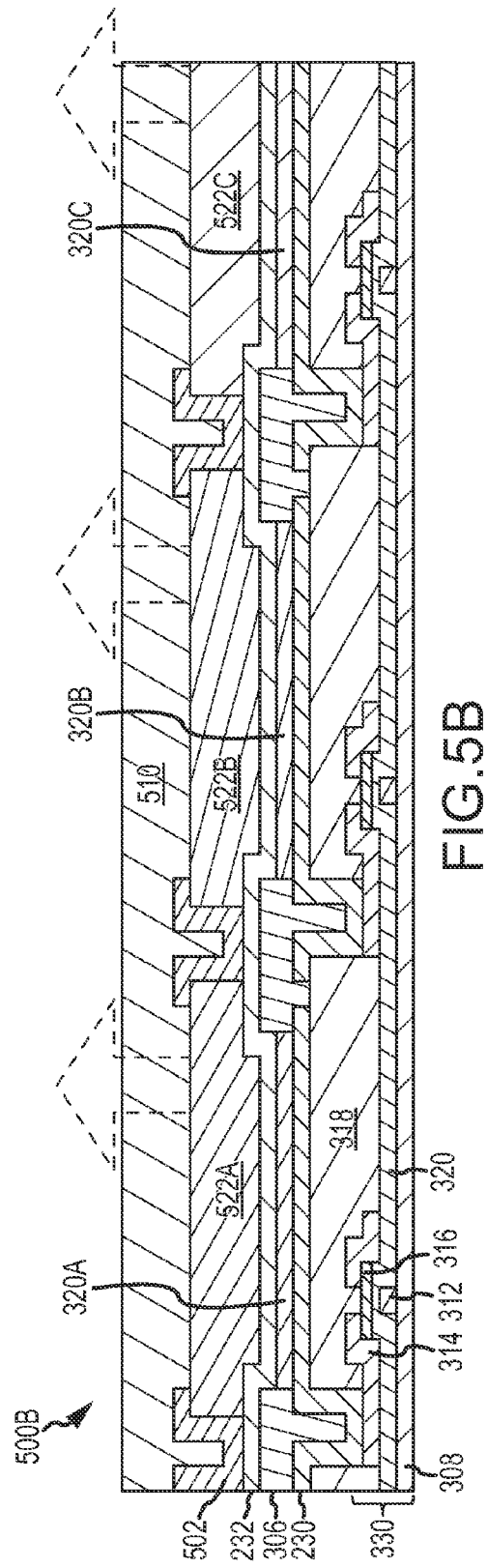

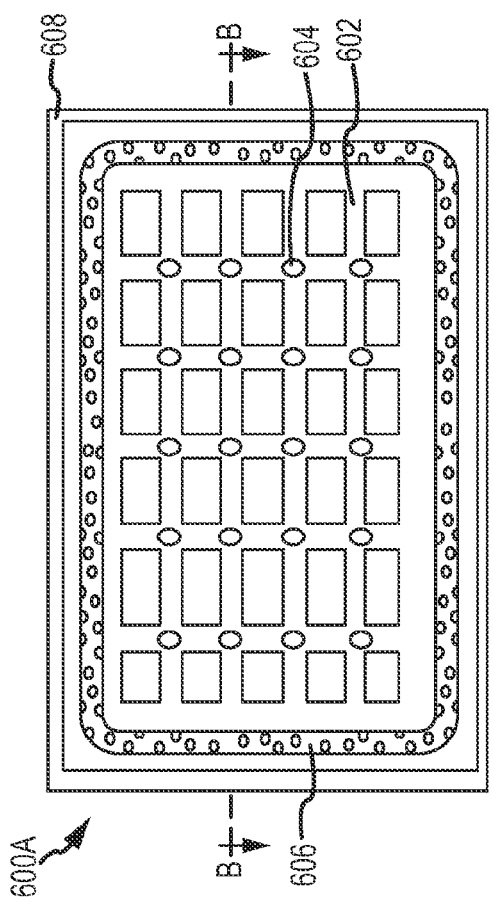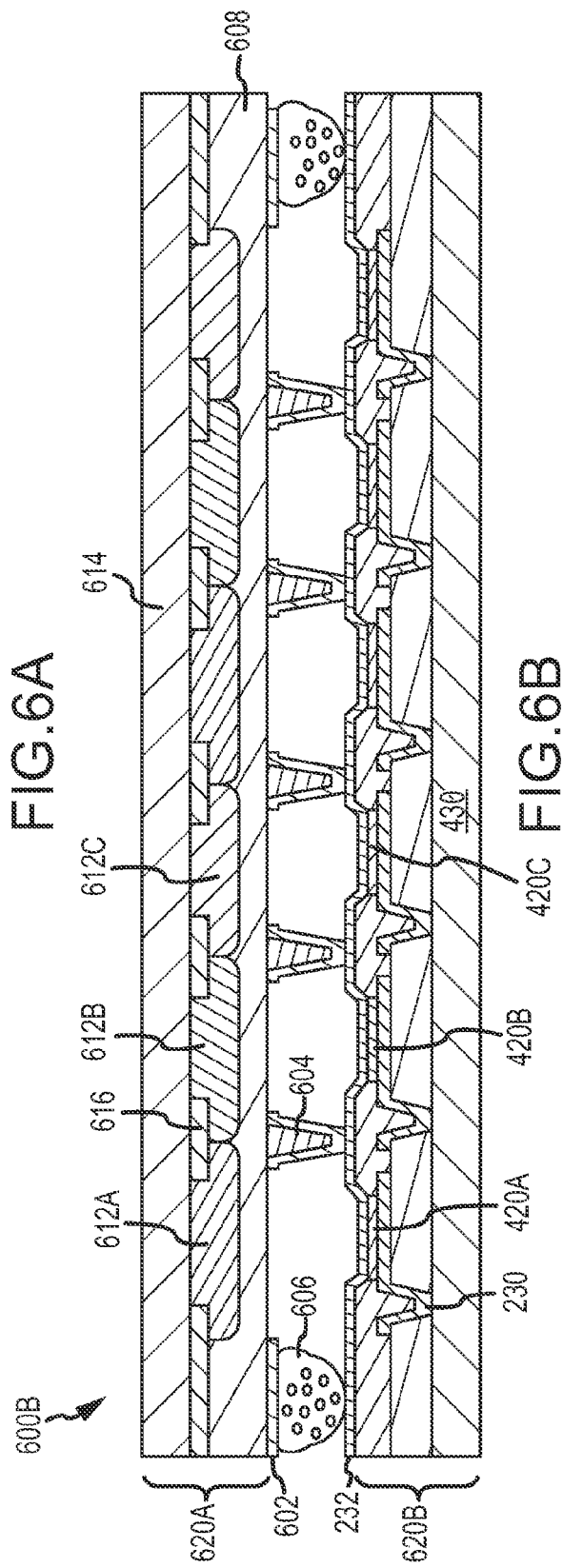

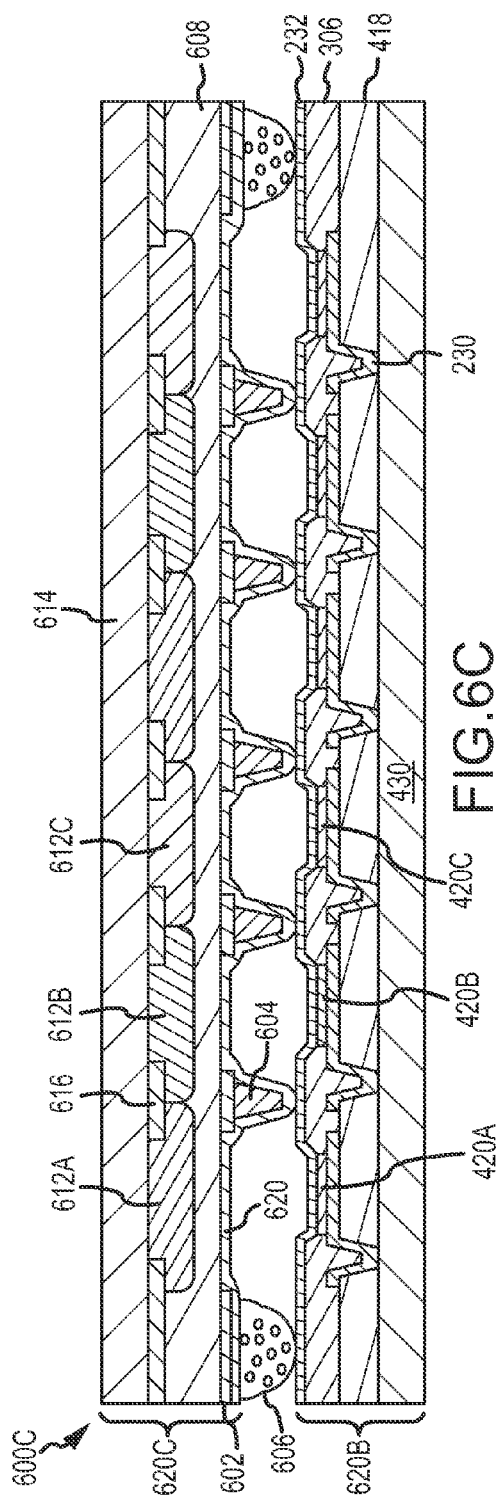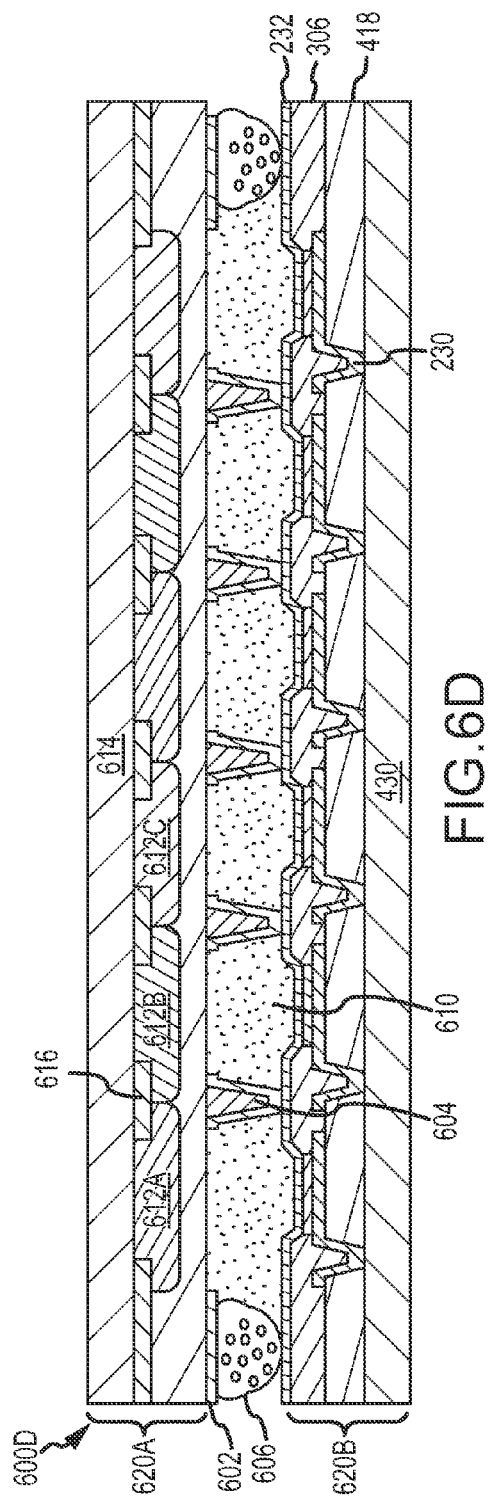

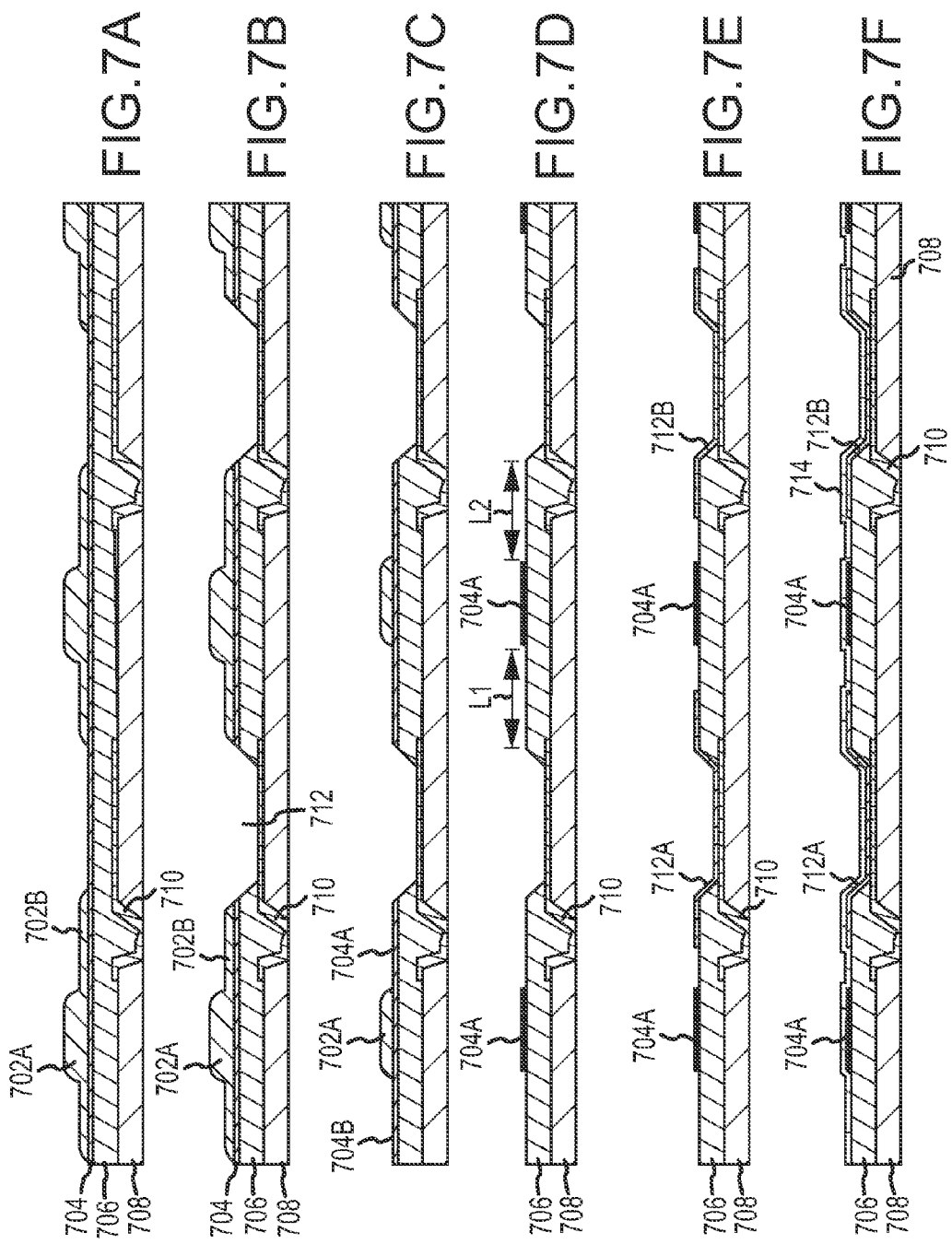

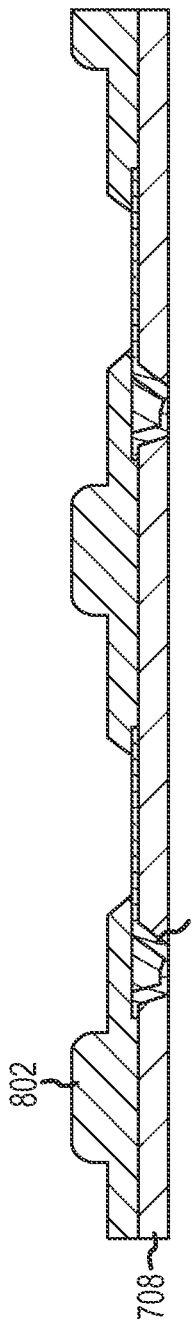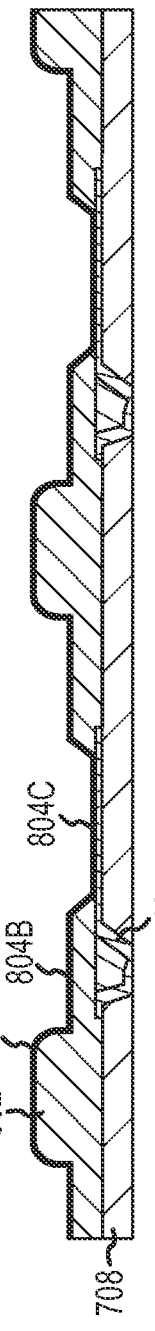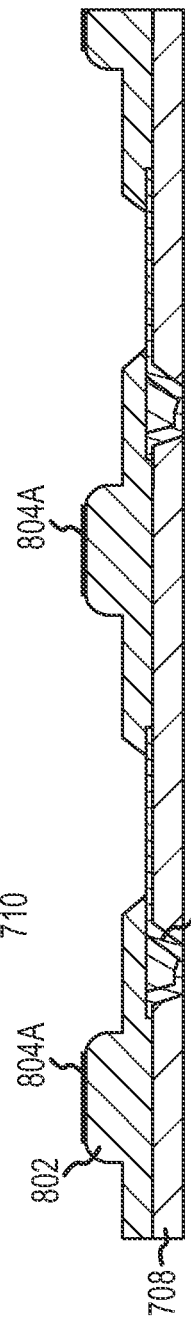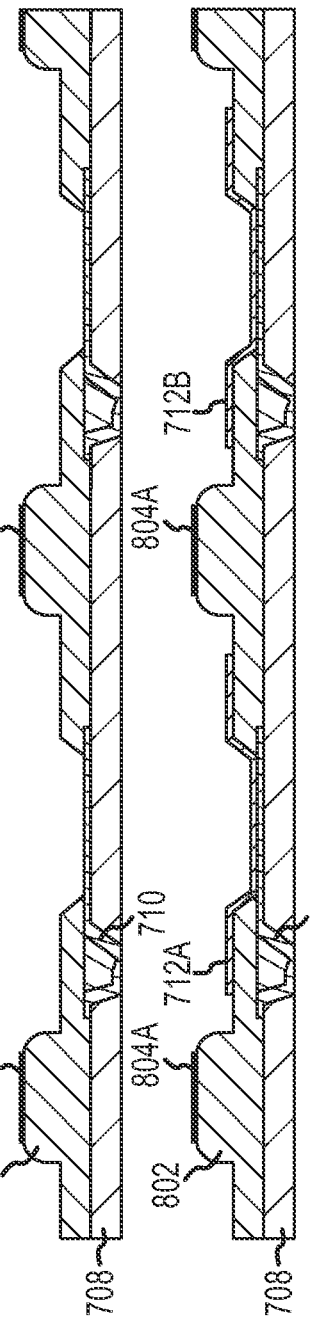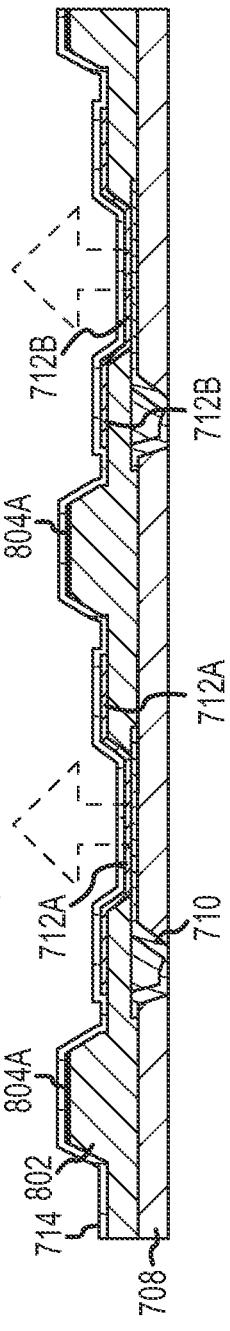

REDUCING SHEET RESISTANCE FOR COMMON ELECTRODE IN TOP EMISSION ORGANIC LIGHT EMITTING DIODE DISPLAY

TECHNICAL FIELD

Embodiments described herein generally relate to top emission organic light emitting diode (OLED) displays. More specifically, certain embodiments relate to designs and processes for reducing sheet resistance for a common electrode in a top emission OLED display.

BACKGROUND

Active matrix organic light emitting diode (AMOLED) displays are becoming more main stream, due to their better contrast ratios when compared to conventional liquid crystal displays (LCDs). AMOLED displays are self-emissive devices, and do not require backlights. AMOLED displays may also provide more vivid colors and a larger color gamut than the conventional LCDs. Further, AMOLED displays can be made more flexible, thinner, and lighter than a typical LCD.

An OLED generally includes an anode, one or more organic layers, and a cathode. AMOLEDs can either be a bottom emission OLED or a top emission OLED. In bottom emission OLEDs, the light is extracted from an anode side. In such embodiments, the anode is generally transparent, while a cathode is generally reflective. The pixel area is shared between the OLED and a backplane driving circuit that generally includes one or more thin film transistors (TFT), metal routings, capacitors. The driving circuit may contain several TFTs, signal traces for control signals, and one or more capacitors. As a result, the pixel area may be limited and the corresponding OLED aperture for light emission may likewise be limited, as the aperture generally overlies the pixel area but not the driving circuit.

In a top emission OLED, light is extracted from a cathode side. The cathode is optically transparent, while the anode is reflective. This top emission OLED normally enables a larger OLED aperture than a bottom emission OLED, since the top emission OLED is fabricated on top of TFT.

In a top emission OLED, the common electrode may be formed from a transparent conductive material like indium-tin-oxide (ITO) and/or thin metals such as magnesium and silver. A metal common electrode may have better electrical conductivity than a common electrode formed from ITO, but to the metal common electrodes generally must be very thin in order to be optically transparent or semi-transparent. Such thin metal layers make the sheet resistance of the common electrode relatively large, especially when compared to a common electrode of a bottom emission OLED. Since light does not travel through the common electrode in a bottom emission OLED, the common electrode does not need to be optically transparent and so can be made as thick as desired. Accordingly, the bottom emission OLED may have a much smaller sheet resistance than the top emission OLED. It is desirable to reduce sheet resistance of the common OLED electrode in the top emission OLEDs such that less power may be required from a power supply to operate the OLEDs.

SUMMARY

Embodiments described herein may take the form of AMOLED displays and/or methods for fabricating AMOLED displays. This disclosure provides a conductive mesh or strip on top of the common electrode to reduce sheet resistance of the common electrode. The conductive mesh including a metal may reduce the overall sheet resistance to about one-tenth of the sheet resistance without the conductive mesh or strip. With the conductive mesh or strip, the top emission OLED may have similar sheet resistance to that of the bottom emission OLED. The reduced sheet resistance helps reduce the power required from a power supply to operate the OLEDs.

In one embodiment, an organic light emitting diode display is provided. The display includes a thin film transistor (TFT) substrate. The TFT substrate has a plurality of TFTs for an array of pixels, where each TFT has a gate electrode, a source electrode, and a drain electrode. The display also includes an organic layer disposed over the TFT substrate, where the organic layer has through-hole above the drain electrode. The display further includes a plurality of pixel electrodes disposed over the organic layer, where each pixel electrode is connected to the drain electrode in the through-hole of the organic layer for each pixel. The display also includes an organic light emitting diode (OLED) layer disposed over the pixel electrode for each pixel. The organic light emitting layer is divided into a plurality of pixels by a pixel defining layer (PDL) over the pixel electrode. The display further includes a common electrode and a conductive layer disposed over the OLED layer such that the conductive layer does not block light emission from the organic light emitting layer.

In another embodiment, an organic light emitting diode display is provided. The display includes a thin film transistor (TFT) substrate that has a plurality of TFTs for an array of pixels. Each TFT has a gate electrode, a source electrode, and a drain electrode. The display also includes an organic layer disposed over the TFT substrate, the organic layer having through-hole above the drain electrode. The display further includes a plurality of pixel electrodes disposed over the organic layer, each pixel electrode being connected to the drain electrode in the through-hole of the organic layer for each pixel. The display also includes an organic light emitting diode (OLED) layer disposed over the pixel electrode for each pixel. The organic light emitting layer is divided into a plurality of pixels by a pixel defining layer (PDL) over the pixel electrode. The display further includes a common electrode disposed over the PDL and the light emitting layer for the plurality of pixels. The display also includes a color filter glass and an array of conductive spacers coupled the color filter glass. The display further includes a conductive mesh disposed over the color filter glass and the conductive spacers above the PDL such that the conductive mesh does not block light emission from the organic light emitting layer. The display also includes a conductive sealant coupled between the conductive mesh and the common electrode.

Additional embodiments and features are set forth in part in the description that follows, and in part will become apparent to those skilled in the art upon examination of the specification or may be learned by the practice of the embodiments discussed herein. A further understanding of the nature and advantages of certain embodiments may be realized by reference to the remaining portions of the specification and the drawings, which forms a part of this disclosure.

BRIEF DESCRIPTION OF THE DRAWINGS

FIG. 2A is a circuit diagram of a standard top emission OLED with a P-type TFT in accordance with embodiments of the present disclosure.

FIG. 2B is a circuit diagram of a standard top emission OLED with an N-type TFT in accordance with embodiments of the present disclosure.

FIG. 3A is a top view of the conductive mesh covering pixel defining regions between sub-pixels in accordance with first embodiment of the present disclosure.

FIG. 3B is a top view of the conductive mesh covering pixel defining regions between sub-pixels in an alternative embodiment of FIG. 3A.

FIG. 5A illustrates a cross-sectional view of a top emission OLED with a conductive strip or mesh and a thin film encapsulation (TFE) layer in accordance with eighth embodiment of the present disclosure.

FIG. 5B illustrates a cross-sectional view of a top emission OLED with a conductive strip or mesh and a TFE layer in accordance with ninth embodiment of the present disclosure.

FIG. 6A is a top view of a conductive mesh with conductive spacers covering pixel defining regions between sub-pixels in accordance with eleventh embodiment of the present disclosure.

FIG. 6B illustrates a cross-sectional view of a top emission OLED with a conductive mesh and spacers of FIG. 6A in accordance with twelfth embodiment of the present disclosure.

FIG. 6C illustrates a cross-sectional view of a top emission OLED with a conductive mesh and spacers and an ITO layer of FIG. 6A in accordance with thirteenth embodiment of the present disclosure.

FIG. 6D illustrates a cross-sectional view of a top emission OLED with a conductive mesh and spacers and conductive desiccant of FIG. 6A in accordance with fourteenth embodiment of the present disclosure.

FIG. 7A illustrates a cross-sectional view of an embodiment during operation of a process architecture, including PDL and metal successive depositions with halftone mask (HTM) photolithography for forming a top emission OLED.

FIG. 7B shows a cross-sectional view of an embodiment during operation of the process architecture, including HTM photo patterning, for forming the top emission OLED display following the operation of FIG. 7A.

FIG. 7C shows a cross-sectional view of an embodiment during operation of the process architecture, including ashing, for forming the top emission OLED display following the operation of FIG. 7B.

FIG. 7D shows a cross-sectional view of an embodiment during operation of the process architecture, including metal etching, for forming the top emission OLED display following the operation of FIG. 7C.

FIG. 7E shows a cross-sectional view of an embodiment during operation of the process architecture, including OLED deposition, for forming the top emission OLED display following the operation of FIG. 7D.

FIG. 7F shows a cross-sectional view of an embodiment during operation of the process architecture, including cathode deposition, for forming the top emission OLED display following the operation of FIG. 7E.

FIG. 8A illustrates a cross-sectional view of an embodiment during operation of a process architecture, including PDL coating and photo patterning for forming a top emission OLED.

FIG. 8B shows a cross-sectional view of an embodiment during operation of the process architecture, including metal deposition, for forming the top emission OLED display following the operation of FIG. 8A.

FIG. 8C shows a cross-sectional view of an embodiment during operation of the process architecture, including metal photo patterning, for forming the top emission OLED display following the operation of FIG. 8B.

FIG. 8D shows a cross-sectional view of an embodiment during operation of the process architecture, including OLED deposition, for forming the top emission OLED display following the operation of FIG. 8C.

FIG. 8E shows a cross-sectional view of an embodiment during operation of the process architecture, including cathode deposition, for forming the top emission OLED display following the operation of FIG. 8D.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

This disclosure presents top emission AMOLED displays having a conductive mesh (es) or conductive strips coupled to a common electrode to reduce sheet resistance of the common electrode. Reduced sheet resistance of the common electrode helps save power consumption in operating the AMOLED displays. The disclosure also presents top emission AMOLED displays with conductive spacers coupled to the conductive mesh or strips which may be coupled to the cathode in some embodiments. The conductive mesh or strips and conductive spacers are in a pixel defining region and do not block lights from the OLED emitting regions. The disclosure further presents embodiments of top emission AMOLED displays with conductive spacers coupled to the conductive mesh or strip and optionally transparent conductive desiccant coupled to the conductive mesh or strip and the cathode. The transparent conductive desiccant further helps reduce the overall resistance of the common electrode. Transparent conductive desiccant may fill the space between conductive spacers in some embodiments. The disclosure also provides various embodiments of AMOLED displays. The OLED display may include a P-type TFT or an N-type TFT. The OLED display may also be regular or inverted OLED. The OLED display may include a white OLED emissive layer (EML) and color filters to output different colors, such as red, green, and blue. Alternatively, the OLED may also include separate red, green and blue OLED EMLs. Furthermore, in some embodiments, the OLED display may include a transparent conductive layer or a thin film encapsulation (TFE) layer to cover the common electrode to provide a stronger barrier to humidity and to protect the common electrode from any damage during the mesh or strip patterning. The disclosure also provides methods for fabricating such top emission OLED displays.

AMOLED displays may be used in a variety of computing displays and devices, including notebook computers, desktop computers, tablet computing devices, mobile phones (including smart phones), automobile in-cabin displays, on appliances, as televisions, and so on. In AMOLED displays, a thin-film transistor (TFT) is used as a switching element in an active matrix. Typically, display pixels are addressed in rows and columns, which may reduce the connection count from millions for each individual pixel to thousands, when compared to a display having pixels addressed only by rows and/or columns. The column and row wires attach to transistor switches; at least one transistor is present for each pixel. The one-way current passing characteristic of the transistor prevents the charge applied to the pixel from draining between refreshes of the display image.

Figure 1A:
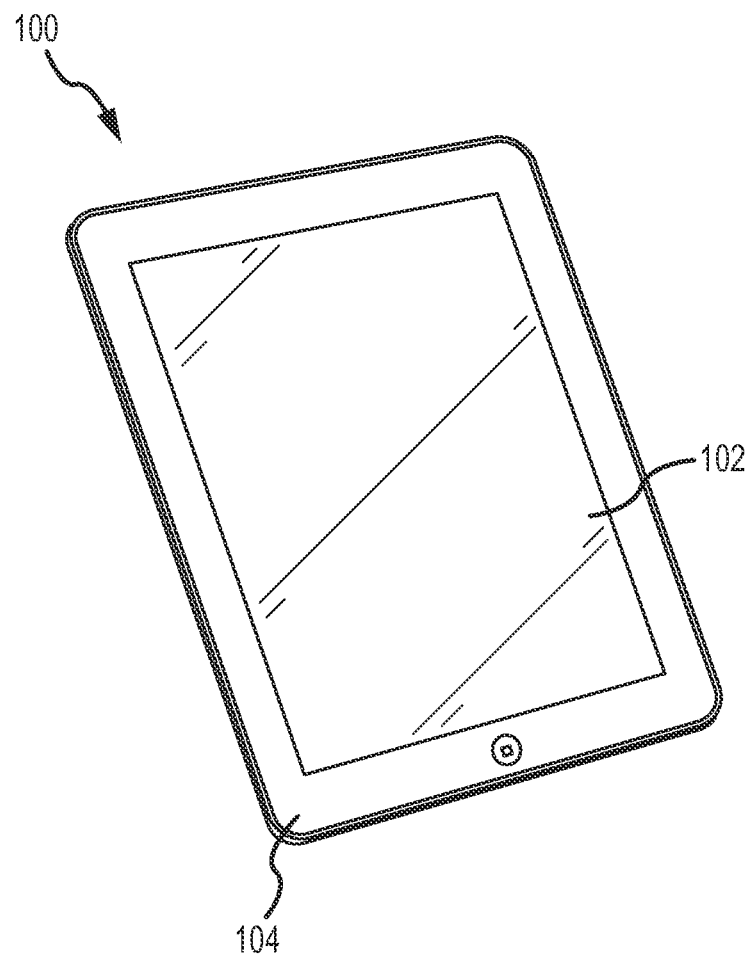
FIG. 1A illustrates a perspective view of a sample electronic device in accordance with one embodiment of the present disclosure.

FIG. 1A illustrates a perspective view of a sample electronic device, namely a tablet computer, in accordance with certain embodiments of the present disclosure. The electronic device includes a touch screen display 100 enclosed by a housing 104. The touch screen display 100 incorporates a cover glass 102 and an AMOLED display behind the cover glass 102, although alternative embodiments may employ an LCD instead of an organic light-emitting display.

Figure 1B:
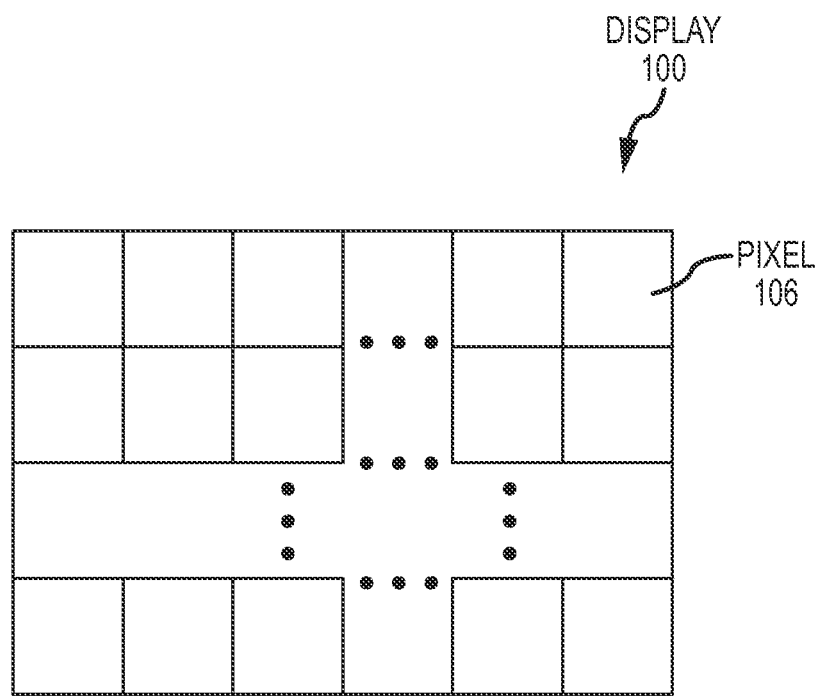
FIG. 1B illustrates an array of pixels that may be embodied in the display of FIG. 1A in accordance with certain embodiments of the present disclosure.
Figure 1C:
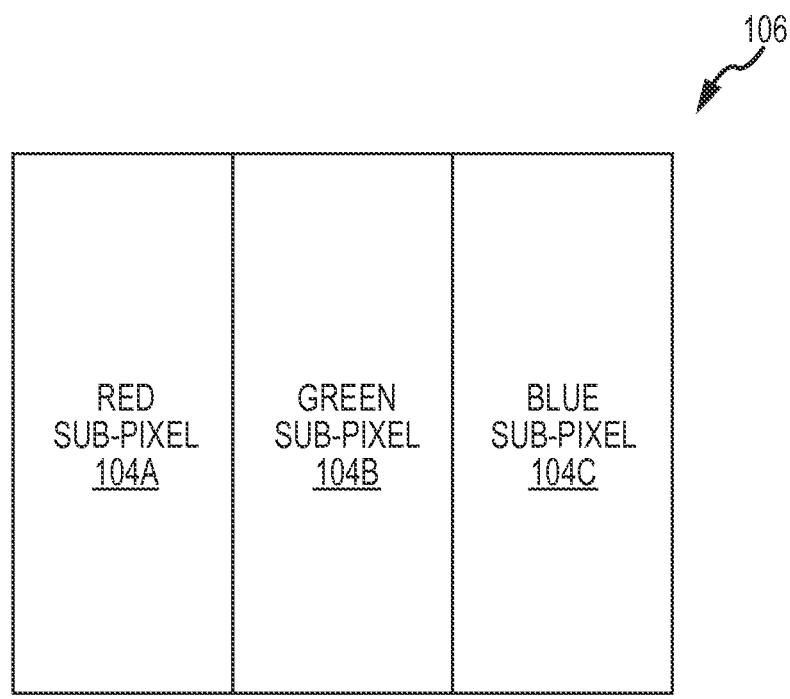
FIG. 1C illustrates a detailed view of the pixel of FIG. 1B showing sub-pixels in accordance with certain embodiments of the present disclosure.

FIG. 1B illustrates a sectional view of the display of FIG. 1A showing an array of pixels in accordance with certain embodiments of the present disclosure. As shown, display 100 includes an array of pixels 106. There are a number of rows of pixels and a number of columns of pixels. The dots between the rows and between the columns signify that the number of rows and columns may be arbitrary; that is, the number of rows and columns may vary between embodiments and no fixed number of either is required for any given embodiment or to incorporate the teachings in this document. The number of pixels depends upon the size and resolution of the display. A pixel may be divided into sub-pixels of different colors. FIG. 1C illustrates a detailed view of a sample pixel of FIG. 1B showing a group of sub-pixels 104A, 104B, 104C that make up the pixel 106, in accordance with certain embodiments of the present disclosure. As shown, pixel 106 may include red sub-pixel 104A, green sub-pixel 104B, and blue sub-pixel 104C. The sub-pixels are arranged to share the pixel area such that each sub-pixel 104A, 104B, or 104C is smaller than the pixel 106. It should be appreciated that the layout of the sub-pixels 104A, 104B, 104C showing in FIG. 1C is but one sample layout; the relative positions and alignments of the sub-pixels may vary between embodiments.

Top emission OLEDs generally have a longer operating life than do bottom emission OLEDs. The is because top emission OLEDs may have a larger light emission aperture than do bottom emission OLEDs, which may help reduce current density in the OLED. When the current density is high in the OLED, more heat is generated when the OLED emits light, such that a life time of the OLED may be shortened. The current requirement generally increases with the display panel size. For example, even if the number of pixels per inch (PPI) is not high in a large sized display (e.g., the display may have low resolution, despite its size), the current requirement may still be large because of the larger panel size. A low PPI may be 80 or less, in some embodiments.

AMOLED displays generally are designed for long usage lives. For example, a lifetime equal or greater than 50,000 hours for such displays may be required. Therefore, employing top emission OLED displays in such products may help increase the OLED aperture, reduce current density through the OLED, and improve the OLED lifetime.

FIG. 2A is a circuit diagram of a regular top emission OLED with a P-type TFT in accordance with embodiments of the present disclosure. Circuit diagram 200A includes an OLED, a first transistor $T_1$ as a switch and a second transistor $T_2$ as a driver, which provides a current to the OLED. Circuit diagram 200A also includes a driving circuit below gate line 208 and a compensation circuit 210. The driving circuit is coupled to a data line 206 and a gate line 208 and a power supply (VDD) 202. The compensation circuit 210 is coupled to a control line 212 and VDD 202. The driving and compensation circuits may work together. For example, the driving circuit provides current to the OLED while the compensation circuit 210 helps provide stability of the driver transistor over time. Typically, the driver is "ON" for the entire frame time of the display and thus is subjected to a degradation of stability over time. Passing electric current through the transistors under the operating voltages of the transistors causes the threshold voltages to increase over the lifetime of the display. When the threshold voltages increase, the currents supplied by the transistors are reduced, thereby reducing the luminance of the OLEDs.

Because different pixels have different luminance histories, e.g. some are turned on for longer periods of time than others, threshold voltage variations may cause non-uniformity in brightness across the display. The compensation circuit also compensates for spatial mismatch in the transistor properties such as threshold voltage and mobility. This spatial mismatch is produced because of the transistor manufacturing process. Therefore, the compensation circuit generally compensates for an increase in the "turn ON" voltage of the OLED, and a voltage drop for the OLED.

The driving circuit generally includes two thin film transistors (TFTs), i.e. transistors $T_1$ and $T_2$, and a storage capacitor $C_1$. The transistor $T_2$ is used as a driver for the OLED sub-pixel 236 and is connected in series with the OLED sub-pixel 236 to regulate the current through the OLED sub-pixel 236. The driver transistor $T_2$ supplies a current to the OLED according to the voltage level stored in the storage capacitor C-storage 250 so that the OLED operates at a desired luminance level. The transistor $T_1$ is used as a switch to apply a desired voltage to the gate of driver $T_2$. The storage capacitor 250 stores a voltage level representing a desired luminance of a pixel. The luminance of the OLED sub-pixel 236 depends on the OLED current, which is provided by the driver or transistor $T_2$. The current through the OLED only goes one way from anode 230 to cathode 232 of the OLED.

Storage capacitor C-storage 250 is coupled between the gate 248 of driver $T_2$ and source 246 of driver $T_2$. Anode 230 of OLED sub-pixel 236 is coupled to drain of $T_2$. The storage capacitor C-storage 250 stores a voltage for controlling transistor $T_2$. The switch transistor $T_1$ connects the capacitor C-storage to the data line 206. The data line 206 supplies a data voltage $V_{data}$ which represents a user-defined pixel luminance level.

The current through the OLED sub-pixel 236 is regulated by a difference between a gate voltage of $T_2$ and a source voltage of $T_2$, i.e. gate-to-source voltage ($V_{GS}$). Driver $T_2$ generally operates in a saturation region to ensure that the current through the OLED is a function of the gate voltage. For the driver $T_2$ to operate in the saturation region, a first order condition is that drain-to-source voltage $V_{DS}$ is equal or greater than $V_{GS}$-$V_T$, where $V_T$ is the threshold voltage for driver $T_2$ and is positive such that $V_{DS}$ is always larger than $V_{GS}$. The sheet resistance of the cathode 234A is in series with the OLED sub-pixel 236 such that there is an additional voltage which is equal to a product of the current by the cathode resistance 234A which is referred to a current-resistance (IR) bump on the cathode 232. The power supply (VDD) 202 to provide the TFT source voltage needs to be higher to accommodate the IR bump on the cathode of the OLED.

The cathode 232 is very thin, for example, a few tens of nanometers, which increases the sheet resistance of the cathode 234A. In the standard top emission OLED, the cathode sheet resistance is about 4 to 8 ohms per square. Such relatively large cathode sheet resistance coupled with higher current in large size AMOLEDs requires an additional voltage or IR bump on the cathode 232 for the standard OLED. Therefore, the high sheet resistance of the common electrode results in a power increase of VDD to account for the IR effect on the common electrode. When the voltage at node 240 increases because of the IR bump on the cathode, the voltage at the anode 230 of the OLED must increase in order to maintain steady OLED current. This, in turn, requires the gate voltage to increase to provide the same $V_{GS}$ to the TFT. Thus the power supply VDD providing the TFT source voltage needs to be higher to accommodate the IR bump on the cathode of the OLED to ensure that the TFT operates in the saturation region. To reduce the sheet resistance, the present disclosure adds a resistor 238 with low resistance in parallel with the cathode sheet resistance 234A such that the total resistance between cathode 232 and node 240 is reduced. The resistor 238 may be formed of a conductive mesh or strip, which is added to the non-emissive region and thus does not block light emission. Therefore, the resistor does not require optical transparency and also does not limit on the thickness of the conductive mesh or strip.

FIG. 2B is a circuit diagram of a standard top emission OLED with an N-type TFT in accordance with embodiments of the present disclosure. In contrast, the VDD provides the drain voltage of the second transistor T2 in this embodiment, as shown in FIG. 2B. Note that the source and drain of driver $T_2$ switches positions compared to FIG. 2A. Thus, storage capacitor C-storage 250 is still coupled to the gate 248 and source of driver $T_2$ which is connected to anode 230. The source is now connected to anode 230 of the OLED sub-pixel 236. Circuit diagram 200B also shows a resistance 234B associated with the cathode which is the common electrode for the standard OLED. When the voltage at node 240 increases because of the a voltage on the cathode 232, which is equal to the product of the resistance 234B and the current through the OLED, the voltage at the anode 230 of the OLED rises in order to maintain steady OLED current. This, in turn, requires that the gate voltage increases to provide the same $V_{GS}$ to the TFT, and so the drain voltage VDD 202 should be increased to ensure that the TFT operates in the saturation region. Similar to FIG. 2A, a resistor 238 is added to be in parallel with the cathode sheet resistance 234A to reduce the total resistance between cathode 232 and node 240.

Figure 2C:
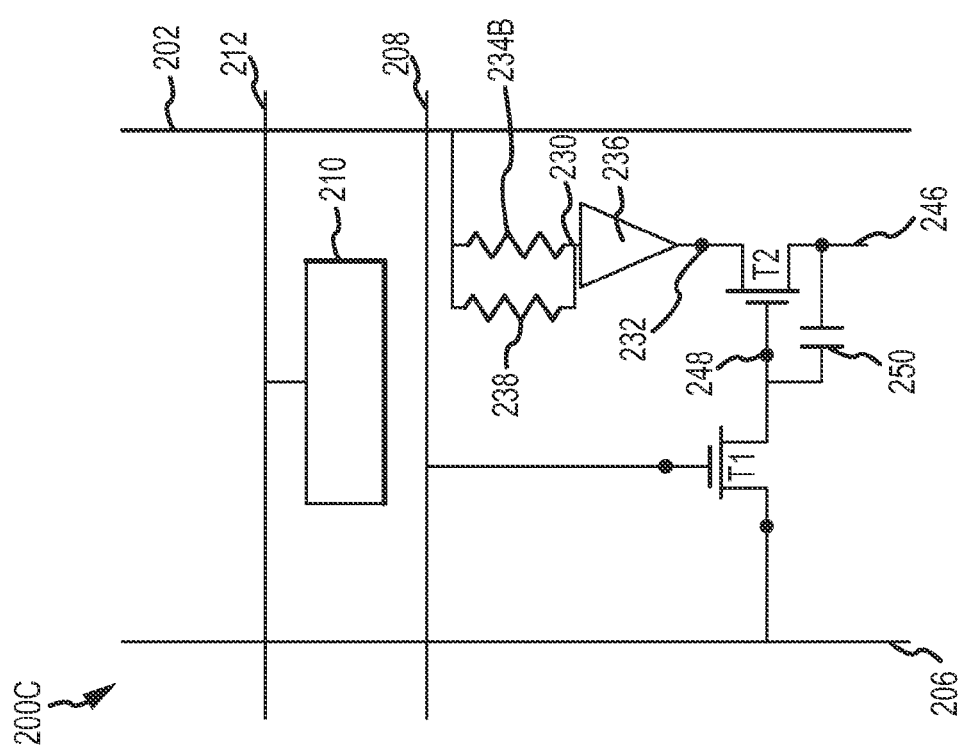
FIG. 2C is a circuit diagram of an inverted top emission OLED with an N-type TFT in accordance with embodiments of the present disclosure.

FIG. 2C is a circuit diagram of an inverted top emission OLED with an N-type TFT in accordance with embodiments of the present disclosure. VDD 202 provides the drain voltage to driver $T_2$. An additional voltage is required from the VDD due to the high sheet resistance 234B on the anode 230 which is the common electrode 232 in the inverted OLED. Note that the cathode 232 of the OLED sub-pixel 236 is connected to the drain of $T_2$. The anode resistance 234B is connected to the anode 230 and the VDD 202. Similar to FIG. 2A, a resistor 238 is added to be in parallel with the anode sheet resistance 234B to reduce the total resistance between anode 230 and VDD 202.

Regardless of the standard OLED or inverted OLED, the large sheet resistance due to the thin common electrode results in a larger rail-to-rail voltage for the OLED, which requires greater power from VDD 202. The present disclosure provides methods to reduce the sheet resistance of the common electrode for a top emission AMOLED. It will be appreciated by those skilled in the art that the embodiments may also include inverted OLED with a P-type TFT.

The OLED material generally is sensitive to humidity and other environmental conditions, thus any fabrication steps after the OLED deposition may be carefully controlled under a vacuum condition. To minimize possible OLED layer contamination, large contacts of the conductive mesh with the common electrode may not be made every sub-pixel. Instead the large contacts may be made at a lower spatial density.

FIG. 3A is a top view of the conductive mesh above pixel defining layer 306 between sub-pixels in accordance with first embodiment of the present disclosure. In FIG. 3A, a contact 302A between OLED common electrode and the conductive mesh may be made at every green sub-pixel 304B. Because the green OLED sub-pixel 304B has the highest efficiency among the red sub-pixel 304C, green sub-pixel 304B and blue sub-pixel 304A OLEDs, the green aperture 304B may be a little smaller than the red and blue apertures 304C and 304A, as shown in FIG. 3A.

FIG. 3B is a top view of the conductive mesh above pixel defining layer 306 between sub-pixels in an alternative embodiment of FIG. 3A. As shown in FIG. 3B, a contact 302B between the conductive mesh 238 and the cathode 232 is made at every white sub-pixel 304D.

Both FIGS. 3A and 3B illustrate that the large contact locations may be arranged in a regular pattern or a predictable manner. It will be appreciated by those skilled in the art that contacts may be made at every other green OLED sub-pixel 304B, or every other white OLED sub-pixel 304D or other regular patterns and the like. It is also possible to further reduce the contact spatial density.

Figure 3C:
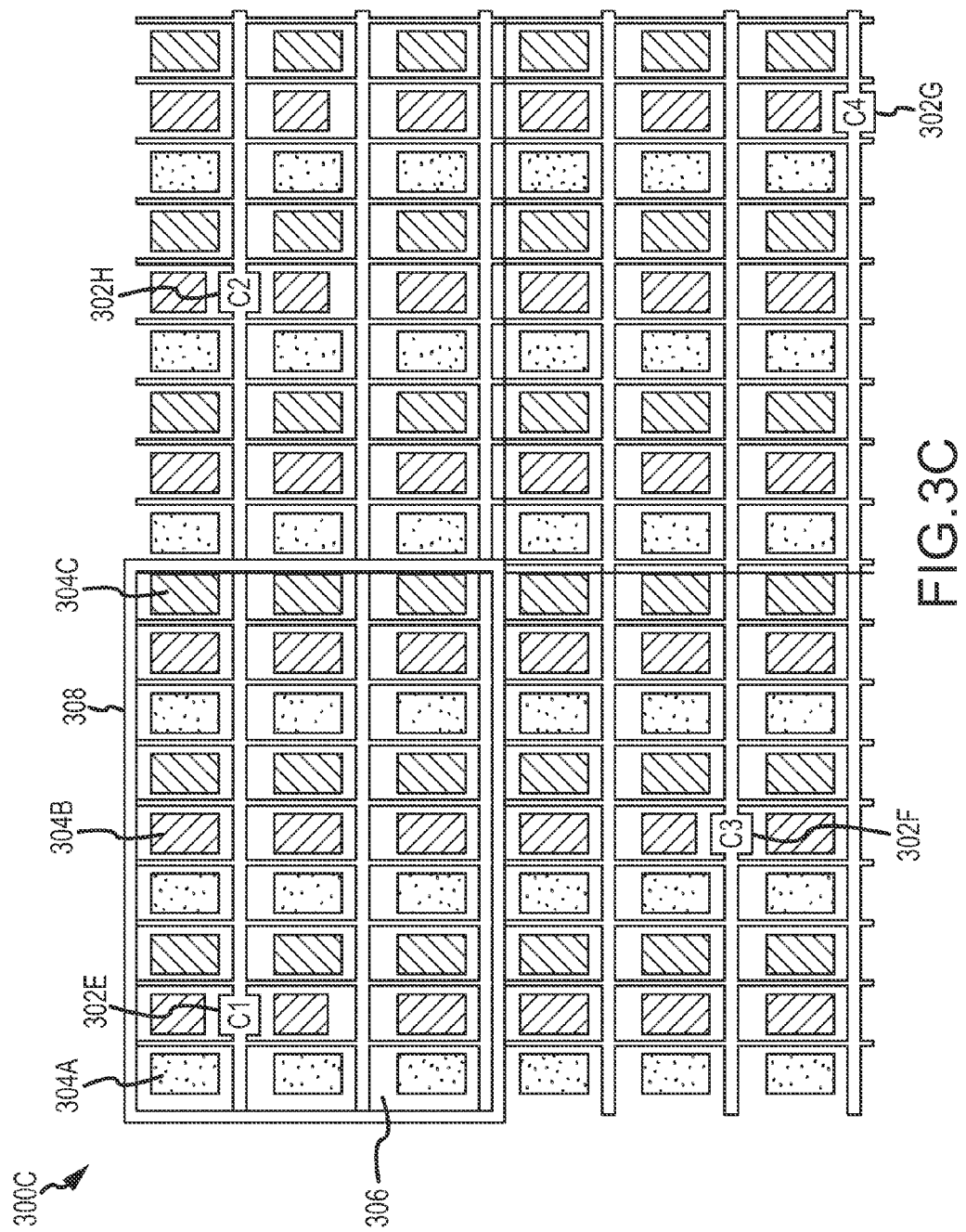
FIG. 3C is a top view of the conductive mesh covering pixel defining regions between sub-pixels in accordance with second embodiment of the present disclosure.

FIG. 3C is a top view of the conductive mesh above pixel defining layer 306 between sub-pixels in accordance with second embodiment of the present disclosure. FIG. 3C shows one contact for every twenty-seven sub-pixels. The contacts 302C, 302D, 302E, and 302F between the conductive mesh and the cathode are still made at the green sub-pixel 304B, but the location of the green sub-pixel within the set 308 of twenty-seven sub-pixels may be random. For example, large contacts 302C-F are in different locations of the four regions 308, each region including twenty-seven sub-pixels. This changing contact location ensures that it is difficult for a viewer to discern any pattern.

Figure 3D:
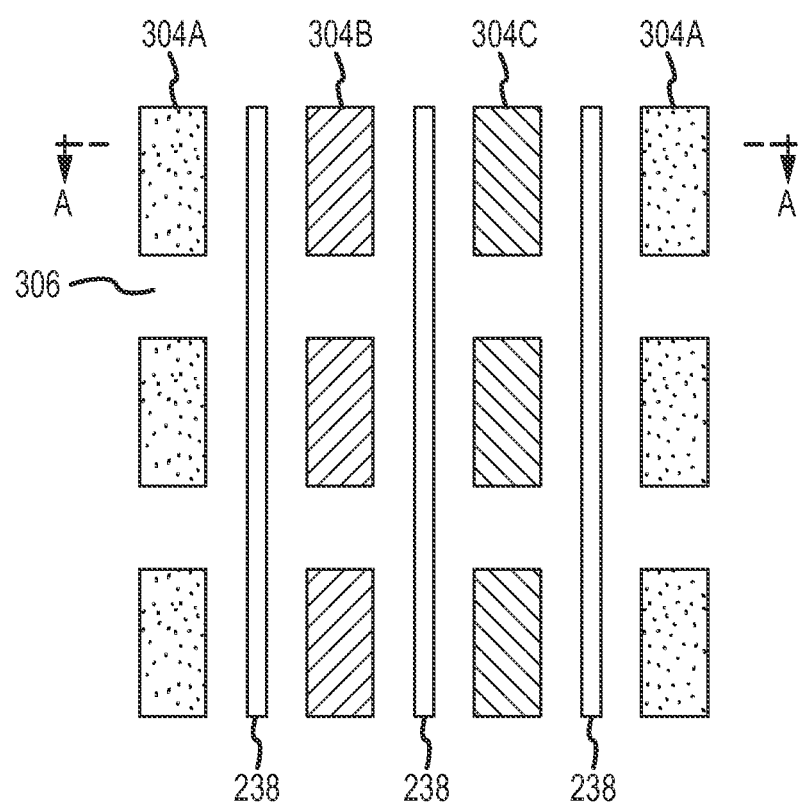
FIG. 3D is a top view of the conductive strip covering pixel defining region between sub-pixels in accordance with third embodiment of the present disclosure.

FIG. 3D is a top view of the conductive strip above pixel defining layer (PDL) 306 between sub-pixels in accordance with third embodiment of the present disclosure. The conductive strips 238 overlap with the PDL 306 and do not block light emission from the sub-pixel regions 304A, 304B, and 304C. It will be appreciated by those skilled in the art that other conductive patterning than the mesh or strip may be used.

Figure 4A:
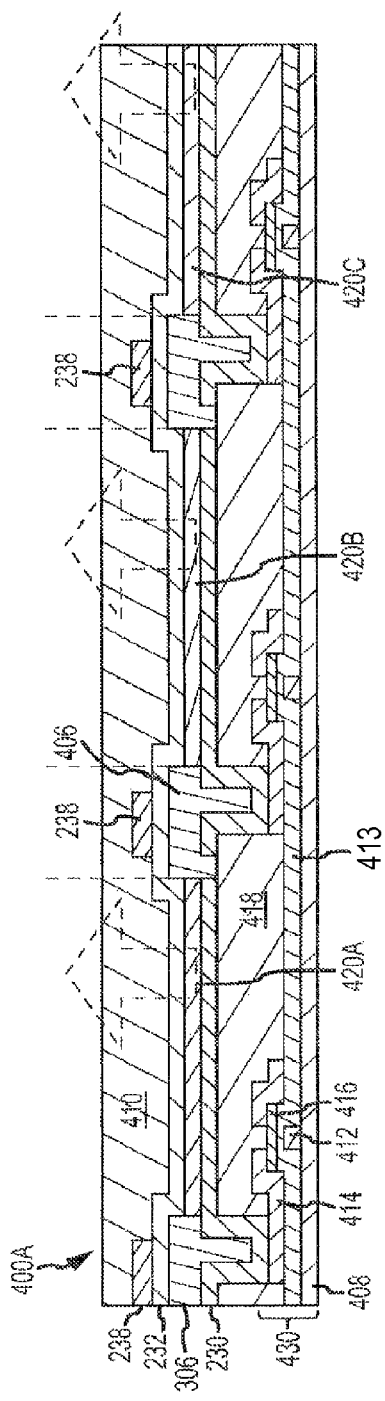
FIG. 4A illustrates a cross-sectional view of a top emission OLED with a conductive strip or mesh in accordance with fourth embodiment of the present disclosure.

FIG. 4A illustrates a cross-sectional view of a top emission OLED with a conductive strip or mesh in accordance with fourth embodiment of the present disclosure. The cross-section is taken as arrows A-A shown in FIG. 3A. As shown, top emission OLED display 400A includes a TFT substrate 430, an anode 230, a cathode 232, and an OLED emissive layer (EML) 420 situated between the anode 230 and cathode 232 for a single pixel. A conductive mesh or strip 238 is added on the top of the cathode 232 above the region of a pixel defining layer (PDL) 306 as shown between two vertical dash lines to help reduce the sheet resistance of the cathode. This region above the PDL does not overlap with the emissive layer and thus does not need to be optically transparent or semi-transparent. A thin film encapsulation (TFE) layer 410 is disposed over the conductive mesh or strip 238 and the cathode 232. The emissive layer 420 has a first sub-pixel region EML 420A for emitting red light, a second sub-pixel region EML 420B for emitting green light, and a third sub-pixel region EML 420C for emitting green light. The sub-pixel regions are defined by a pixel defining layer 306. The PDL layer 306 may be formed of an organic material or an inorganic material. The anode 230 is disposed over a planarization (PLN) layer 418, which is disposed on top of the TFT substrate 430. The planarization layer 418 may be formed of an organic material.

The TFT substrate 430 includes a substrate 408 and gate metals 412 corresponding to each sub-pixel region 120A, 1206, and 120C on the substrate 408. The TFT substrate 430 also includes a gate insulator 413 disposed over the gate metals 412. The TFT substrate further includes a series of channels 416, source and drain metals 414 patterned on the gate insulator 413. The channels 416 are formed from a semiconductor, which may be amorphous silicon (a-Si) or metal oxide such as an indium-gallium-zinc oxide (IGZO), and the like. As shown, light emitted from the EMLs 420A, 420B, and 420C comes from the top surface of the display, as shown by the arrow.

The top emission OLED 400A is structured so that a first electrode 230 (anode) is formed from a light-reflecting material and a second electrode 232 (cathode) is formed from a transparent material or semi-transparent material in order to transmit light without significant absorption. The cathode 232 may be formed of a transparent conductive layer, such as indium-tin oxide (ITO) or a thin silver or magnesium-silver film. The cathode may also be formed of other transparent materials, including, but not limited to, inorganic compound, such as lithium fluoride (LiF), and the like.

The EML emits light in response to an electric current provided to the EML and includes an organic compound that functions as the light-emitting material. The organic compound includes small molecules which may be deposited by evaporation in a vacuum, as a polymer based solution.

The anode 230 injects holes into the organic layer when a positive potential relative to the cathode is applied. The anode 230 may include a light reflector to increase the efficiency of light emission through the top emission OLED.

The substrate may include or be formed of various materials that may be opaque, semitransparent or transparent, such as glass, ceramic, metal, plastic, and the like. The substrate may take any suitable form, such as a rigid plate, flexible sheet, or curved surface(s). The substrate may also be an active matrix substrate that includes one or more thin-film transistors, such as a TFT substrate. It will be appreciated by those skilled in the art that the substrate may also include other circuit elements.

The OLED device can be fabricated as a standard OLED as shown in FIG. 4A, where the cathode 232 is a common electrode shared by all pixels. The OLED device may also be fabricated as an inverted OLED, where the anode 230 is the common electrode. Compared to the standard OLED, the inverted OLED exchanges the anode 230 and cathode 232. Regardless of the standard OLED or inverted OLED, the common electrode in the top emission OLEDs is transparent or semi-transparent. As one example, the common electrode is a combination of a transparent conductive oxide material like indium-tin-oxide (ITO) and/or thin metals such as magnesium (Mg) and silver (Ag). If formed from Mg or Ag, the common electrode should be made very thin for transparency.

Figure 4B:
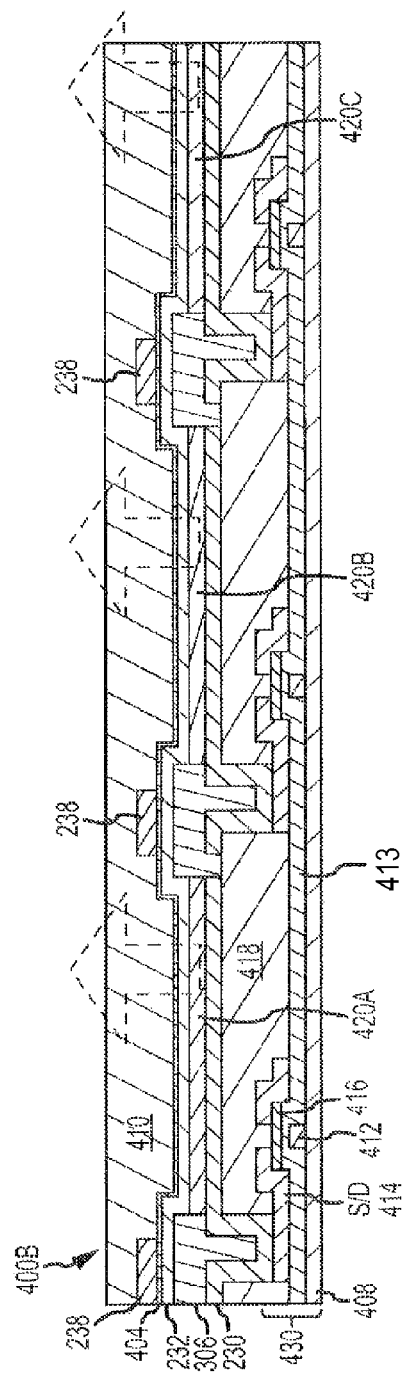
FIG. 4B illustrates a cross-sectional view of a top emission OLED with a conductive strip or mesh and an additional indium-zinc oxide (IZO) layer in accordance with fifth embodiment of the present disclosure.

FIG. 4B illustrates a cross-sectional view of a top emission OLED having a conductive strip or mesh and an additional IZO layer in accordance with fifth embodiment of the present disclosure. FIG. 4B is very similar to FIG. 4A except that a transparent material 304 such as indium-zinc oxide (IZO) is added on the top of the entire cathode. When the cathode 232 includes or is formed from a very thin metal, such as Ag/Mg, patterning the conductive mesh or conductive strip may damage the cathode and underlying OLED layers. The IZO 304 may provide a barrier against humidity and may protect the cathode 232 from any damage during the patterning of the conductive mesh 238 or strip.

Figure 4C:
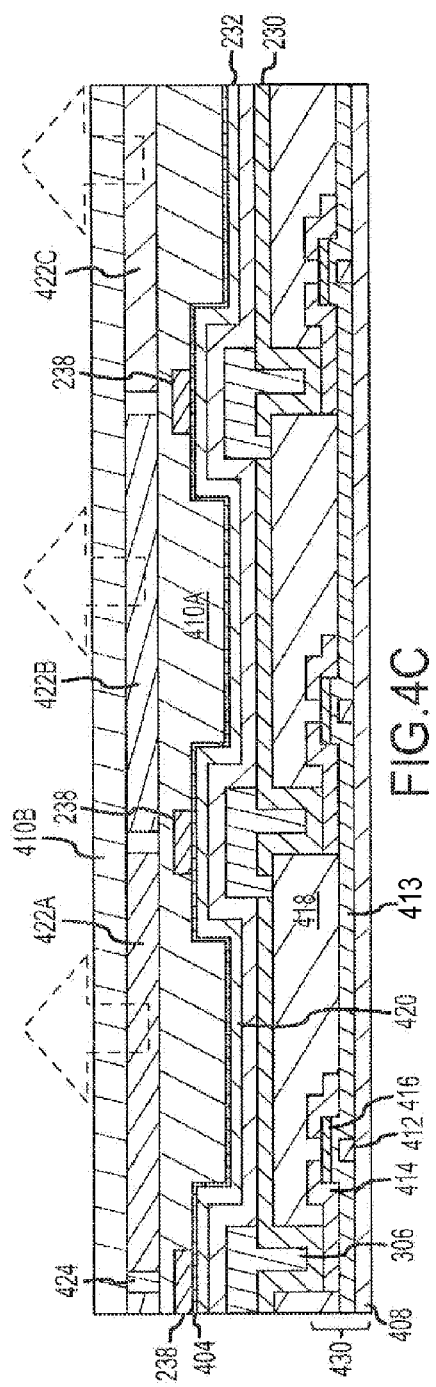
FIG. 4C illustrates a cross-sectional view of a top emission OLED with a conductive strip or mesh and an additional IZO layer in accordance with sixth embodiment of the present disclosure.

FIG. 4C illustrates a cross-sectional view of a top emission OLED with a conductive strip or mesh and an additional IZO layer in accordance with sixth embodiment of the present disclosure. Top emission OLED 400C includes a white EML 420 instead of separate EMLs for red, green and blue colors, as shown in FIG. 4B. To output different colors, color filters 322A, 322B, and 322C corresponding to red, green and blue color are added over the first TFE 410A. The color filters are separated by black matrix 324. The black matrix includes an absorbing material for light. A second TFE 410B is disposed over the color filters and the first TFE 410A. The first and second TFEs 410A-B may be formed from transparent insulator, such as organic material.

Figure 4D:
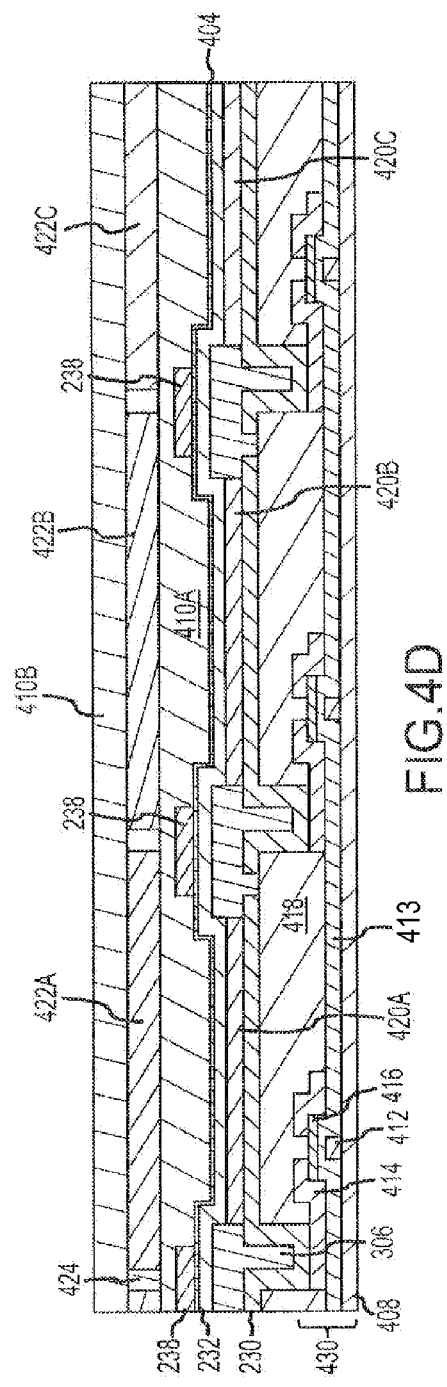
FIG. 4D illustrates a cross-sectional view of a top emission OLED with a conductive strip or mesh and an additional IZO layer in accordance with seventh embodiment of the present disclosure.

FIG. 4D illustrates a cross-sectional view of a top emission OLED with a conductive strip or mesh and an additional IZO layer in accordance with seventh embodiment of the present disclosure. FIG. 4D includes separate RGB EMLs, instead of the common white OLED EML as shown in FIG. 4C. Color filters 322A-C may be optionally added over the first TFE 410A. Color filters 322A-C may not be necessary in this embodiment since separate RGB OLED EMLs 420A-C are employed. The color filters are covered by a second TFE 410B. A combination of color filters and microcavities between the anode and cathode may help enhance color purity. The combination may also help reduce power by eliminating a circular polarizer.

The conductive mesh or strip 238 generally has good electrical conductivity and also a low surface reflection. In a particular embodiment, the conductive mesh or strip may be formed from a combination of chromium (Cr) and chromium oxide (CrOx) with an organic black matrix hybrid. Alternatively, the conductive mesh or strip may include molybdenum (Mo) or an alloy of Mo and copper (Mo/Cu).

Figure 5C:
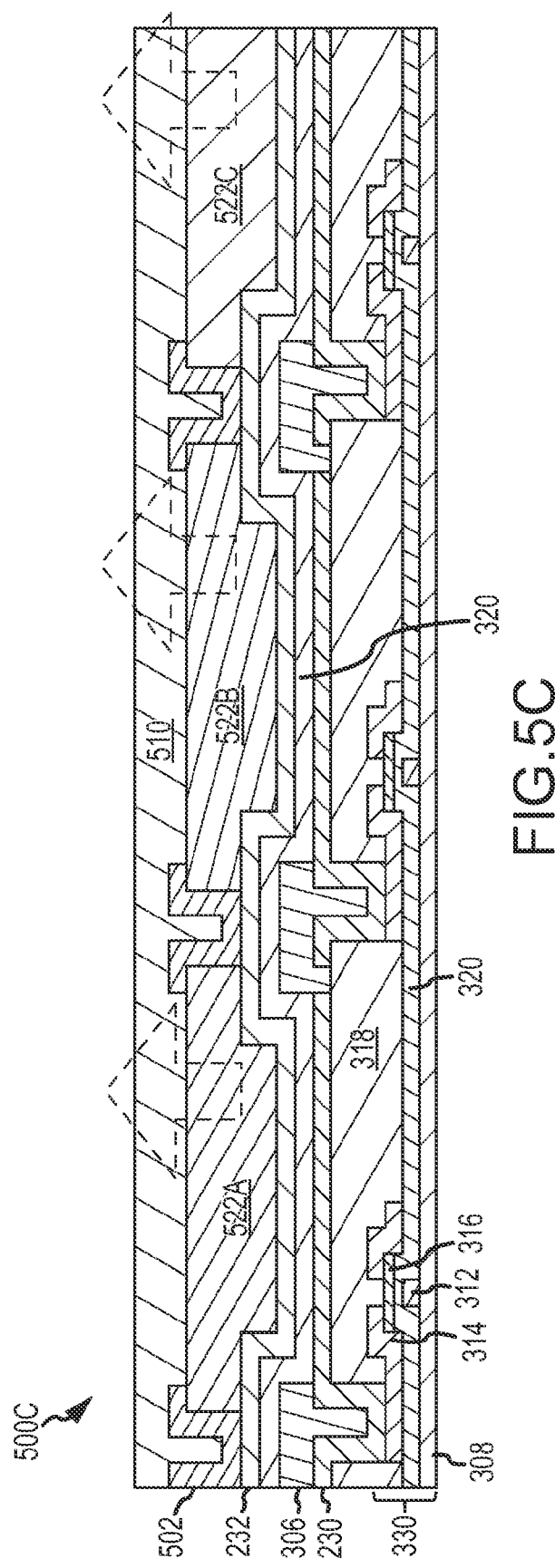
FIG. 5C illustrates a cross-sectional view of a top emission OLED with a conductive strip or mesh and a TFE layer in accordance with tenth embodiment of the present disclosure.

FIGS. 5A-5C show alternative ways of forming conductive mesh from FIGS. 4B-4D. Instead of using the IZO 304 to protect the cathode, a thin film encapsulation (TFE) 510A is used to protect the cathode 232. FIG. 5A illustrates a cross-sectional view of a top emission OLED with a conductive strip or mesh in accordance with eighth embodiment of the present disclosure. FIG. 5A is similar to FIG. 4A from the bottom substrate to the cathode, but has a different top portion from FIG. 4A. As shown in FIG. 5A, a first TFE 510A is added on a first portion of the cathode 232 to protect the OLED layers 420A-C. Then, above the PDL 306, a conductive mesh 502 is added to a second portion of the cathode 232 and extends to cover a portion of the top surface of the first TFE 510A. The PDL region 306 divides OLED layers 420 into pixels or sub-pixels 420A-C, such that no light emission takes place in the PDL regions. Adding a conductive mesh or conductive strips in the PDL region does not damage the OLED layers, because the first TFE protects the OLEDs during deposition of the conductive mesh or strips. A second TFE layer 510B is disposed over the conductive mesh 502 and the first TFE layer 510A. Between the anode 230 and the cathode 232, red, green, and blue OLED EMLs 420A-C are disposed. Again, the conductive mesh 502 provides good electrical conductivity and low reflectivity simultaneously. In this embodiment, the cathode is protected by the first TFE such that an IZO 304 as shown in FIG. 4B is not necessary.

FIG. 5B illustrates a cross-sectional view of a top emission OLED with a conductive strip or mesh in accordance with ninth embodiment of the present disclosure. FIG. 5B is similar to FIG. 5A except that the color filters 522A-C replace the first TFE 510A in FIG. 5A. The color filters 522A-C are disposed over the cathode 232 above the OLED EML regions 420A-C.

FIG. 5C illustrates a cross-sectional view of a top emission OLED with a conductive strip or mesh in accordance with tenth embodiment of the present disclosure. FIG. 5C is similar to FIG. 5B except that the red, green, blue EMLs are replaced by a white EML 420. As shown in FIG. 5C, a white OLED EML 420 is disposed over the PDL 306 and the anode 230. Note that the white OLED EML 420 is not patterned, unlike red, green, and blue OLED EMLs 420A-C which are divided by the PDL 306 as shown in FIGS. 5A and 5B. Rather, color filters 522A-C are disposed over the cathode to provide different colors of emitted light, such as red, green, and blue. In this embodiment, color filters 522A-C are also used as a planarization layer, and are patterned using photolithography to expose a portion of the cathode above the PDL region, such that a conductive mesh is disposed over the exposed cathode above the PDL region. The conductive mesh or strips may be deposited using a shadow mask.

The top emission OLEDs may be fabricated with various methods by using shadow masks for depositing the EMLs.

The conductive mesh may be deposited by sputtering with a shadow mask. The shadow mask has openings in the PDL regions to allow deposition of the conductive mess. This shadow mask is different from the shadow masks used for depositing the red, green, and blue OLED EMLs. Color filters are added after the conductive mesh is deposited.

FIG. 6A is a top view of a conductive mesh with conductive spacers covering pixel defining regions between sub-pixels in accordance with eleventh embodiment of the present disclosure. As shown in FIG. 6A, a metal mesh 602 and some conductive spacers 604 placed on the metal mesh as well as a conductive sealant 606 may be placed near outer edges of the metal mesh.

FIG. 6B illustrates a cross-sectional view of a top emission OLED with a conductive mesh and spacers of FIG. 6A in accordance with twelfth embodiment of the present disclosure. The cross-section is taken as arrows B-B point in FIG. 6A. As shown, a conductive sealant is placed under the metal mesh. The metal mesh 602 makes contact with the cathode 232 above the PDL regions through the conductive spacers 604 and/or the conductive sealant 606. The metal mesh 602 and the conductive spacers may help reduce the sheet resistance of the cathode.

To form such a structure, a top portion 620A and a bottom portion 620B are formed separately, and then the top portion and the bottom portion are bonded together with the conductive sealant 606. To fabricate the top portion, a color filter glass is formed first. Then, black matrix (BM) and one or more color filters are formed over the color filter glass. Each color filter is isolated from a neighboring color filter by the BM. An overcoat 608 covers the black matrix 616 and the color filters 612A-C. The overcoat may be formed of organic materials. Conductive spacers 604 are added at patterned spots to the overcoat 608 and then a conductive mesh 602 is deposited over the conductive spacers and the overcoat near the edges of the OLED display, as shown in FIG. 6A.

To fabricate the bottom portion 620B, a TFT glass that includes TFT formed on a glass substrate is formed first, a planarization layer is deposited over the TFT glass. By using photolithography, some regions of the PLN 418 are removed. Then, patterned anode 230 or pixel electrode is formed over the PLN 418, where the anode 230 is connected to the drain electrode of the TFT. Then, OLED EMLs 420A-C are deposited over the anode 230 and PDL regions 306 are formed between the OLED EMLs. A cathode 232 is then deposited over all the OLED EMLs and the PDL regions.

Once each of the top portion including any color filter glass and the bottom portion including any TFT glass is formed, the bottom portion 620B and the top portion 620A are bonded together by the conductive sealant 606.

FIG. 6C illustrates a cross-sectional view of a top emission OLED with a conductive mesh and spacers and an ITO layer of FIG. 6A in accordance with thirteenth embodiment of the present disclosure. The bottom portion in this embodiment is the same as bottom portion 620B shown in FIG. 6B. To form a top portion 620C, a transparent conductive layer 620, such as an ITO layer, may be added to cover the metal mesh 602 and the conductive spacers 604 in order to provide stability to the spacers and conductive mesh over the overcoat 608. To fabricate the structure, a conductive mesh is formed over the overcoat, and then conductive spacers are added at patterned spots, as illustrated in FIG. 6A. This may be followed by depositing an ITO layer to cover the metal mesh and the conductive spacers.

FIG. 6D illustrates a cross-sectional view of a top emission OLED with a conductive mesh and spacers and conductive desiccant of FIG. 6A, in accordance with fourteenth embodiment of the present disclosure. The top and bottom portions in this embodiment is the same as top portion 620A bottom portion 620B shown in FIG. 6B. Transparent conductive desiccants 610 fill the space between the cathode 232 on the TFT glass 430 and the overcoat 608 on the color filters 612A-C, as shown in FIG. 6D. This can be achieved by adding silver nanowire or other conductive nanowires to the desiccant.

Photolithography Process

The conductive mesh or strip may also be deposited using photolithography rather than using a shadow mask as discussed earlier. The present disclosure provides two embodiments of photolithography process flows. In other embodiments, the conductive mesh 238 shown in FIGS. 4A-4D may be swapped with the position of the cathode 232. The process flows form a structure with the conductive mesh under the cathode (see FIG. 7F and FIG. 8E below).

One embodiment of the process flow is shown in FIGS. 7A-7F. FIG. 7A illustrates a cross-sectional view of an embodiment during operation of a process architecture, including PDL and metal successive depositions with halftone mask (HTM) photolithography for forming a top emission OLED. As shown in FIG. 7A, successive depositions are done first, including forming patterned anode 710 over a planarization layer (PLN) 708 (also referred to a dielectric interlayer), depositing a PDL 706 over the PLN layer 708, and depositing a metal layer over the PDL 706. Then, a halftone mask (HTM) 702 covers a first portion of the metal layer 704 and leaves a second portion exposed. The HTM 702 includes a thicker portion 702A and a thinner portion 702B. Specifically, the HTM may be formed of a photoresist layer.

FIG. 7B shows a cross-sectional view of an embodiment during operation of the process architecture, including HTM photo patterning, for forming the top emission OLED display following the operation of FIG. 7A. As shown, the portion of the metal layer 704 and the PDL 706 not covered by the HTM 702 is etched or removed such that a portion of the anode layer 710 is exposed. Depending upon the type of photoresist used in the HTM, either developed photoresist or unexposed photoresist may be removed by wet etching. Generally, a photoresist film may be made of a photosensitive material, which exposes to light (or particular wavelengths of light) to develop the photoresist. The developed photoresist may be insoluble or soluble to a developer.

In one embodiment, a positive photoresist is first deposited on a surface, and then light is selectively passed through a patterned photo mask that may block light in certain areas. The unexposed photoresist film is developed through the patterned photo mask to form the photoresist patterns. In other words, the photoresist has the same pattern as the photo mask. The unexposed photoresist film protects the layers underneath during an etching process, such that the portion exposed by the photoresist may be completely removed by the etching process, such as a wet etching. Portions of underlying layers that are protected by photoresist generally are not removed or otherwise etched. After etching to form a pattern of a deposited layer by using photoresist, the insoluble photoresist is removed prior to the next deposition operation. Different masks may be provided to form various films with different patterns. In alternative embodiments, different photoresist may be used. It will be appreciated by those skilled in the art that the photo mask will vary with the negative photoresist.

FIG. 7C shows a cross-sectional view of an embodiment during operation of the process architecture, including ashing, for forming the top emission OLED display following the operation of FIG. 7B. The thinner portion 702B of the HTM is ashed or removed as shown such that only the thicker portion 702A of the HTM is left on top of the metal layer 704.

FIG. 7D shows a cross-sectional view of an embodiment during operation of the process architecture, including metal etching, for forming the top emission OLED display following the operation of FIG. 7C. As shown, a portion of the metal layer not covered by a remaining portion of the HTM is etched such that the remaining portion 704A of the metal layer is substantially symmetric; e.g. width $L_1$ on one side of the remaining portion metal layer 704A is substantially equal to width $L_2$ on another side of the remaining metal layer 704A.

FIG. 7E shows a cross-sectional view of an embodiment during operation of the process architecture, including OLED deposition, for forming the top emission OLED display following the operation of FIG. 7D. As shown, an OLED layer may include 712A and 712B as well as 712C (not shown) for different colors, such as red, green and blue. Shadow masks are used to deposit the OLED layer in the sub-pixel region or OLED aperture area. Different shadow masks may be used for different colors.

FIG. 7F shows a cross-sectional view of an embodiment during operation of the process architecture, including cathode deposition, for the top emission OLED display following the operation of FIG. 7E. As shown, a cathode layer 714 is deposited over the conductive mesh 704 and the OLED 712 as well as the PDL 706. The cathode may be formed of an indium-tin oxide (ITO). The ITO layer may be formed by a sputtering process.

Another embodiment of the process flow is shown in FIGS. 8A-8E. FIG. 8A illustrates a cross-sectional view of an embodiment during operation of a process architecture, including PDL coating and photo patterning for forming a top emission OLED in according with embodiments of the present disclosure. As shown in FIG. 8A, a PDL layer 802 is first formed over anode 710 and PLN 708. The PDL layer 802 includes a first thicker portion 802A, a second thinner portion 802B on both sides of the first thicker portion 802A, and a third etched portion 802C (removed) in the OLED region. This PDL layer may be formed by using a HTM (not shown).

FIG. 8B shows a cross-sectional view of an embodiment during operation of the process architecture, including metal deposition, for forming the top emission OLED display following the operation of FIG. 8A. As shown, the metal layer 804 covers the entire PDL 802 and the exposed anode 710.

FIG. 8C shows a cross-sectional view of an embodiment during operation of the process architecture, including metal photo patterning, for forming the top emission OLED display following the operation of FIG. 8B. As shown, the metal layer 802 is etched with a photoresist mask to remove portion 802B on both sides of a remaining portion 804A and to remove portion 804C in the OLED region to expose a portion of the anode 710. The remaining portion 804A is on the PDL thicker portion 802A.

FIG. 8D shows a cross-sectional view of an embodiment during operation of the process architecture, including OLED deposition, for forming the top emission OLED display following the operation of FIG. 8C. As shown, an OLED layer including 712A and 712B as well as 712C (not shown) for different colors, such as red, green and blue.

FIG. 8E shows a cross-sectional view of an embodiment during operation of the process architecture, including cathode deposition, for forming the top emission OLED display following the operation of FIG. 8D. As shown, a cathode layer 714 is deposited over the conductive mesh 804A on the PDL thicker portion and the OLED 712 as well as the thinner portion of PDL.

The present disclosure provides designs and methods to reduce sheet resistance of the common electrodes of the top emission OLED display. The top emission OLED may have the sheet resistance to be reduced to be about one-tenth of the sheet resistance without conductive mesh or strip, which is about the sheet resistance of a bottom emission OLED.

Having described several embodiments, it will be recognized by those skilled in the art that various modifications, alternative constructions, and equivalents may be used without departing from the spirit of the disclosure. Additionally, a number of well-known processes and elements have not been described in order to avoid unnecessarily obscuring the embodiments disclosed herein. Accordingly, the above description should not be taken as limiting the scope of the document.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An organic light emitting diode display comprising:
   a thin film transistor (TFT) substrate, the TFT substrate having a plurality of TFTs for an array of pixels, each TFT having a gate electrode, a source electrode, and a drain electrode;
   an organic layer disposed over the TFT substrate, the organic layer having a through-hole above each drain electrode;
   a plurality of pixel electrodes disposed over the organic layer, each pixel electrode being connected to the drain electrode in the through-hole of the organic layer for each pixel;
   an organic light emitting diode (OLED) layer with first and second opposing sides disposed over the pixel electrode for each pixel, the organic light emitting diode layer being divided into a plurality of pixels by a pixel defining layer (PDL) over the pixel electrode; and
   a common electrode and a conductive layer disposed over the organic light emitting diode layer such that the conductive layer does not block light emission from the organic light emitting diode layer, wherein each pixel electrode is in direct contact with the first side of the organic light emitting diode layer, wherein the second side of the organic light emitting diode layer is in direct contact with the common electrode, and wherein the conductive layer is in direct contact with the common electrode.

2. The organic light emitting diode display of claim 1, wherein the conductive layer comprises a metal mesh or metal strips.

3. The organic light emitting diode display of claim 1, wherein the common electrode is disposed over the PDL and the organic light emitting diode layer for the plurality of pixels, and the conductive layer is disposed over the common electrode above the PDL.

4. The organic light emitting diode display of claim 1, wherein the conductive layer is disposed over the PDL, and the common electrode is disposed over the conductive layer and the organic light emitting diode layer for the plurality of pixels.

5. The organic light emitting diode display of claim 1, wherein the organic light emitting diode layer comprises a white organic light emitting diode layer, and wherein the organic light emitting diode display further comprises:
   a first thin film encapsulation (TFE) layer over the conductive layer;
   red, green, and blue color filters over the first TFE; and
   a second TFE over the color filters.

6. The organic light emitting diode display of claim 1, wherein the conductive layer comprises a material selected from a group consisting of Cr, CrOx, Mo, Mo with Cu alloy, and IZO with Mo.

7. The organic light emitting diode display of claim 1, wherein the pixel defining layers comprise an organic material.

8. An organic light emitting diode display comprising:
   a thin film transistor (TFT) substrate, the TFT substrate having a plurality of TFTs for an array of pixels, each TFT having a gate electrode, a source electrode, and a drain electrode;
   an organic layer disposed over the TFT substrate, the organic layer having a through-hole above each drain electrode;
   a plurality of pixel electrodes disposed over the organic layer, each pixel electrode being connected to the drain electrode in the through-hole of the organic layer for each pixel;
   an organic light emitting diode (OLED) layer disposed over the pixel electrode for each pixel, the organic light emitting diode layer being divided into a plurality of pixels by a pixel defining layer (PDL) over the pixel electrode;
   a common electrode and a conductive layer disposed over the organic light emitting diode layer such that the conductive layer does not block light emission from the organic light emitting diode layer; and
   a dielectric layer disposed over a first portion of the common electrode such that a second portion of the common electrode is exposed above the PDL region, wherein the dielectric layer has opposing side surfaces connected by a top surface, and wherein the conductive layer directly contacts the side surfaces and the top surface of the dielectric layer.

9. The organic light emitting diode display of claim 8, wherein the organic light emitting diode layer comprises red, green and blue organic light emitting diode layers and the dielectric layer comprises a second TFE.

10. The organic light emitting diode display of claim 8, wherein the organic light emitting diode layer comprises a white organic light emitting diode layer, and wherein the dielectric layer comprises red, green and blue color filters.

11. The organic light emitting diode display of claim 8, wherein the organic light emitting diode layer comprises red, green and blue organic light emitting diode layers and wherein the dielectric layer comprises red, green and blue color filters.

12. The organic light emitting diode display of claim 1, wherein the organic light emitting diode layer comprises red, green, and blue organic light emitting diode layers, and wherein the organic light emitting diode display further comprises a first thin film encapsulation (TFE) layer over the conductive layer.

13. The organic light emitting diode display of claim 12, wherein the transparent conductive layer comprises indium-zinc-oxide (IZO).

14. The organic light emitting diode display of claim 12, further comprising red, green and blue color filters over the first TFE and a second TFE over the color filters.

15. An organic light emitting diode display comprising:
   a thin film transistor (TFT) substrate, the TFT substrate having a plurality of TFTs for an array of pixels, each TFT having a gate electrode, a source electrode, and a drain electrode;
   an organic layer disposed over the TFT substrate, the organic layer having a through-hole above each drain electrode;
   a plurality of pixel electrodes disposed over the organic layer, each pixel electrode being connected to the drain electrode in the through-hole of the organic layer for each pixel;
   an organic light emitting diode (OLED) layer disposed over the pixel electrode for each pixel, the organic light emitting diode layer being divided into a plurality of pixels by a pixel defining layer (PDL) over the pixel electrode;
   a common electrode disposed over the PDL and the organic light emitting diode layer for the plurality of pixels;
   a color filter glass;
   an array of conductive spacers coupled the color filter glass;

a conductive mesh disposed over the color filter glass and the conductive spacers above the PDL such that the conductive mesh does not block light emission from the organic light emitting diode layer; and a conductive sealant coupled between the conductive mesh and the common electrode.

16. The organic light emitting diode display of claim 15, wherein the conductive mesh comprises a contact region with the common electrode, the contact region overlapping with the PDL between two sub-pixels of the same color.

17. The organic light emitting diode display of claim 16, wherein each of the two subpixels comprises a green sub-pixel or a white sub-pixel.

18. The organic light emitting diode display of claim 16, wherein the contact region forms a spatial density smaller than the sub-pixel density.

19. The organic light emitting diode display of claim 15, wherein the array of conductive spacers contacts an overcoat of the color filter glass and the conductive mesh contacts the common electrode.

20. The organic light emitting diode display of claim 15, further comprising a transparent conductive mesh disposed over the conductive spacers and the conductive mesh such that the transparent conductive mesh contacts the common electrode and the conductive sealant.

21. The organic light emitting diode display of claim 20, further comprising transparent conductive desiccant between the common electrode and the conductive mesh.

22. The organic light emitting diode display of claim 21, wherein the conductive desiccant comprises silver nanowires.

23. The organic light emitting diode display of claim 15, wherein the conductive mesh comprises a material selected from a group consisting of Cr, CrOx, Mo, Mo with Cu alloy, and IZO with Mo.

24. The organic light emitting diode display of claim 15, wherein the pixel defining layers comprise an organic material.

25. The organic light emitting diode display of claim 15, wherein the common electrode comprises indium-tin-oxide (ITO).

26. The organic light emitting diode display of claim 15, wherein the pixel electrodes comprise indium-tin-oxide (ITO).

* * * * *